US007001978B2

(12) United States Patent
DeVisser et al.

(10) Patent No.: US 7,001,978 B2

(45) Date of Patent: Feb. 21, 2006

(54) UNSATURATED ESTER SUBSTITUTED POLYMERS WITH REDUCED HALOGEN CONTENT

(75) Inventors: Christine J. DeVisser, Mississauga (CA); Timothy P. Bender, Port Credit (CA)

(73) Assignee: Xerox Corporation, Stamford, CT (US)

(*) Notice: Subject to any disclaimer, the term of this patent is extended or adjusted under 35 U.S.C. 154(b) by 93 days.

(21) Appl. No.: 10/717,295

(22) Filed: Nov. 19, 2003

(65) Prior Publication Data

US 2005/0107575 A1 May 19, 2005

(51) Int. Cl.
*C08G 14/00* (2006.01)
*C08F 20/00* (2006.01)

(52) U.S. Cl. ...................... 528/125; 528/126; 528/220; 528/488; 528/492; 528/501; 528/503; 525/390; 525/437; 525/444; 525/471; 525/534

(58) Field of Classification Search ................ 528/125, 528/126, 220, 488, 492, 501, 503; 525/390, 525/437, 444, 471, 534
See application file for complete search history.

(56) References Cited

U.S. PATENT DOCUMENTS

| | | | | |
|---|---|---|---|---|
| 5,739,254 | A | 4/1998 | Fuller et al. | 528/125 |
| 5,753,783 | A | 5/1998 | Fuller et al. | 525/471 |
| 5,761,809 | A | 6/1998 | Fuller et al. | 29/890.1 |
| 5,773,553 | A | 6/1998 | Fuller et al. | 528/170 |
| 5,814,426 | A | 9/1998 | Fuller et al. | 430/96 |
| 5,849,809 | A | 12/1998 | Narang et al. | 522/35 |
| 5,863,963 | A | 1/1999 | Narang et al. | 522/162 |
| 5,869,595 | A | 2/1999 | Fuller et al. | 528/322 |
| 5,874,192 | A | 2/1999 | Fuller et al. | 430/58 |
| 5,882,814 | A | 3/1999 | Fuller et al. | 430/59 |
| 5,889,077 | A | 3/1999 | Fuller et al. | 522/162 |
| 5,939,206 | A | 8/1999 | Kneezel et al. | 428/480 |
| 5,945,253 | A | 8/1999 | Narang et al. | 430/280.1 |
| 5,958,995 | A | 9/1999 | Narang et al. | 522/35 |
| 5,994,425 | A | 11/1999 | Narang et al. | 522/35 |
| 6,007,877 | A | 12/1999 | Narang et al. | 427/510 |
| 6,020,119 | A | 2/2000 | Foucher et al. | 430/627 |
| 6,022,095 | A | 2/2000 | Narang et al. | 347/20 |
| 6,087,414 | A | 7/2000 | Fuller et al. | 522/162 |
| 6,090,453 | A | 7/2000 | Narang et al. | 427/504 |
| 6,117,967 | A | 9/2000 | Fuller et al. | 258/125 |
| 6,124,372 | A | 9/2000 | Smith et al. | 522/35 |
| 6,139,920 | A | 10/2000 | Smith et al. | 427/510 |
| 6,151,042 | A | 11/2000 | Smith et al. | 347/20 |
| 6,174,636 | B1 | 1/2001 | Fuller et al. | 430/58.7 |
| 6,177,238 | B1 | 1/2001 | Fuller et al. | 430/320 |
| 6,184,263 | B1 | 2/2001 | Narang et al. | 522/111 |
| 6,187,512 | B1 | 2/2001 | Foucher et al. | 430/311 |
| 6,203,143 | B1 | 3/2001 | Narang et al. | 347/65 |
| 6,260,949 | B1 | 7/2001 | Smith et al. | 347/44 |
| 6,260,956 | B1 | 7/2001 | Narang et al. | 347/63 |
| 6,273,543 | B1 | 8/2001 | Narang et al. | 347/20 |
| 6,273,985 | B1 | 8/2001 | DeLouise et al. | 156/273.3 |
| 6,323,301 | B1 | 11/2001 | Smith et al. | 528/125 |
| 6,365,323 | B1 | 4/2002 | Narang et al. | 430/280.1 |
| 6,485,130 | B1 | 11/2002 | DeLouise et al. | 347/63 |

FOREIGN PATENT DOCUMENTS

| | | |
|---|---|---|
| EP | 826700 | 3/1998 |
| EP | 827026 | 3/1998 |
| EP | 827027 | 3/1998 |
| EP | 827028 | 3/1998 |
| EP | 827029 | 3/1998 |
| EP | 827030 | 3/1998 |
| EP | 827031 | 3/1998 |
| EP | 827032 | 3/1998 |
| EP | 827033 | 3/1998 |
| EP | 918256 | 5/1999 |
| EP | 918257 | 5/1999 |
| EP | 918258 | 5/1999 |

OTHER PUBLICATIONS

Copending U.S. Appl. No. 10/322,110, filed Dec. 17, 2002, entitled "Process for Preparing Substituted Polyarylene Ethers, " by Timothy P. Bender.

Copending U.S. Appl. No. 10/040,850, filed Jan. 9, 2002, entitled "Process for Preparing Polyarylene Ethers," by Timothy P. Bender et al.
Copending U.S. Appl. No. 10/036,469, filed Jan. 7, 2002, entitled "High Performance Curable Polymers and Processes for the Preparation Thereof," by Ram S. Narang et al.
English abstract for JP 10120743.
English abstract for JP 10090895.
English abstract for JP 10097073.
English abstract for JP 10090894.
English abstract for JP 10087817.
English abstract for JP 10090896.
English abstract for JP 10104836.
English abstract for JP 10090897.
English abstract for JP 10090899.
English abstract for JP 10090898.
English abstract for JP 11218943.
English abstract for JP 11223956.
English abstract for JP 11223955.
English abstract for JP 200119761.
English abstract for JP 200344884.
English abstract for JP 10100410.

*Primary Examiner*—Samuel A. Acquah
(74) *Attorney, Agent, or Firm*—Judith L. Byorick

(57) ABSTRACT

Polymers of the formula

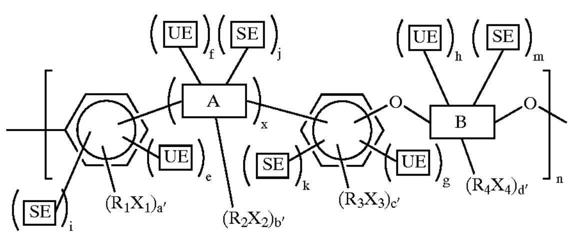

-continued or

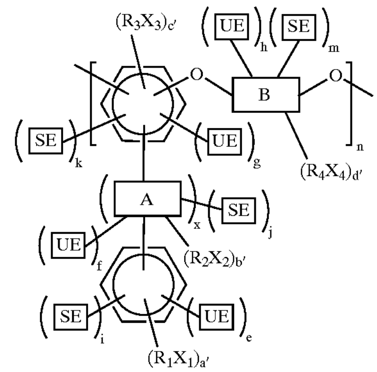

wherein x is 0 or 1, $R_{1-4}$ are alkyl, aryl, arylalkyl, or alkylaryl groups, $X_{1-4}$ are halogens, a', b', c', and d' are 0–4, UE is an unsaturated ester group, e, f, g, and h are 0–4, at least one of e, f, g, and h is ≧1 in at least some monomers, SE is a saturated ester group, i, j, k, and m are 0–4, at least one of i, j, k, and m is ≧1 in at least some monomers, a'+e+i≦4, b'+f+j≦4, c'+g+k≦4, d'+h+m≦4, RX represents the total number of haloalkyl groups in the polymer, the ratio of UE groups to SE groups to RX groups in the polymer is $$\upsilon\epsilon:\sigma\epsilon:\rho\chi$$

wherein $\upsilon\epsilon$ is from about 1 to about 99.99, wherein $\sigma\epsilon$ is from about 0.01 to about 99, wherein $\rho\chi$ is from 0 to about 50, and wherein $\upsilon\epsilon+\sigma\epsilon+\rho\chi=100$.

46 Claims, 1 Drawing Sheet

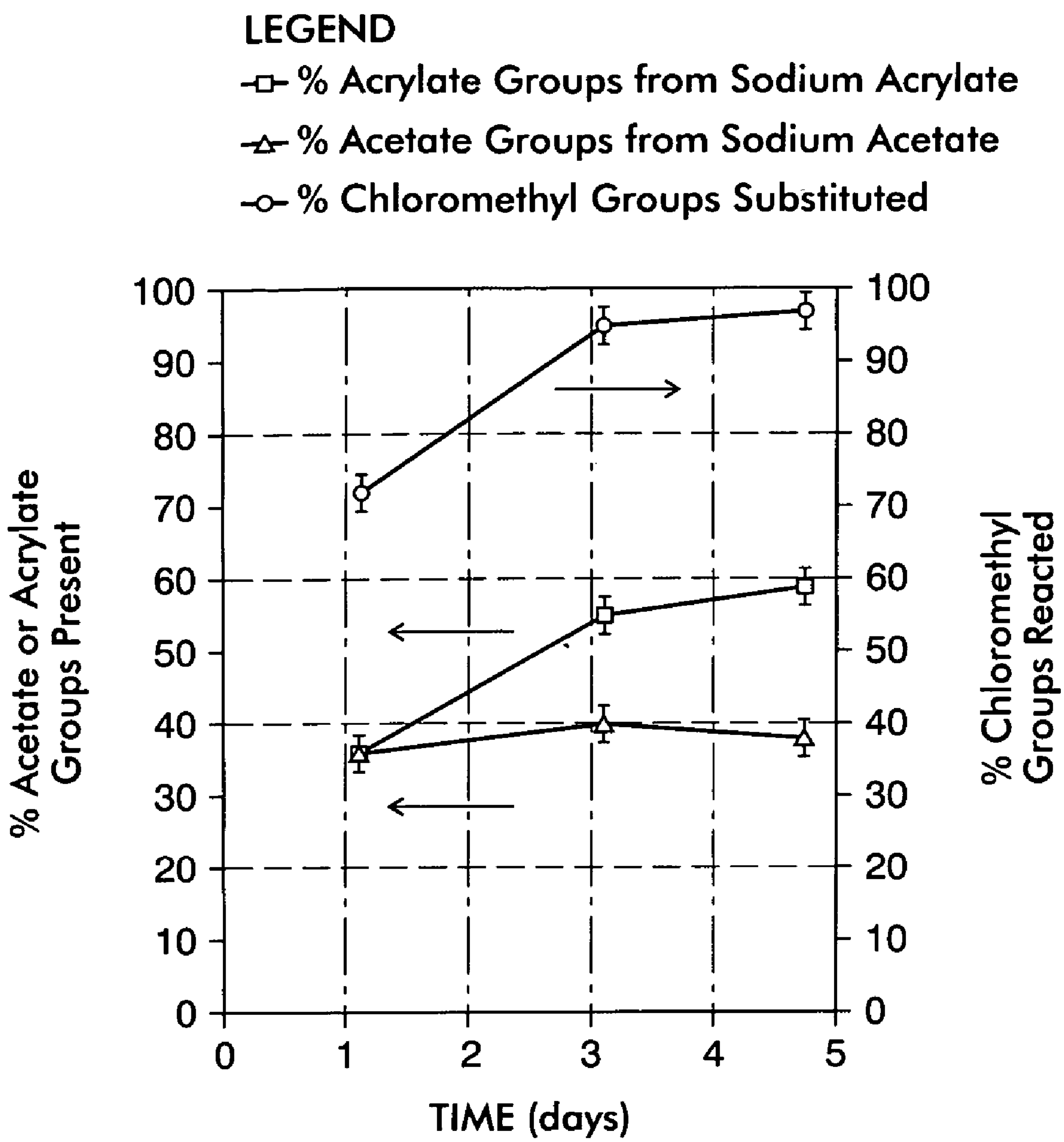
LEGEND
% Acrylate Groups from Sodium Acrylate
% Acetate Groups from Sodium Acetate
% Chloromethyl Groups Substituted
% Acetate or Acrylate Groups Present
% Chloromethyl Groups Reacted
TIME (days)
0
1
2
3
4
5
0
10
20
30
40
50
60
70
80
90
100

UNSATURATED ESTER SUBSTITUTED POLYMERS WITH REDUCED HALOGEN CONTENT

Cross-reference is hereby made to the following copending applications:

Copending application U.S. Ser. No. 10/322,110, filed Dec. 17, 2002, entitled "Process for Preparing Substituted Polyarylene Ethers," with the named inventor Timothy P. Bender, the disclosure of which is totally incorporated herein by reference, discloses processes for preparing polymers of the formula

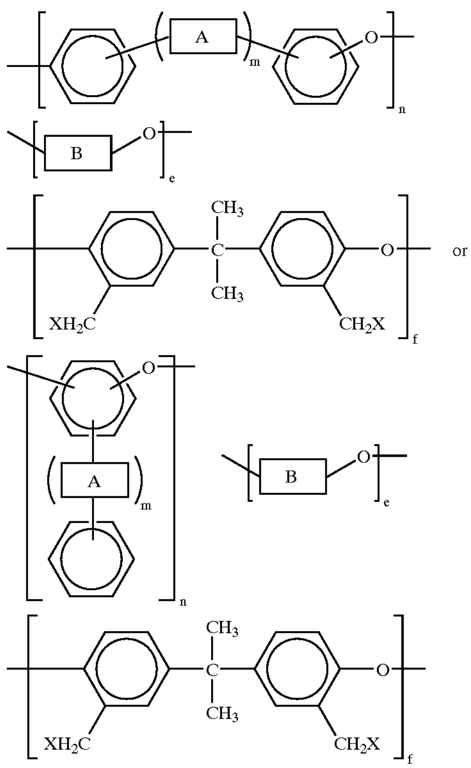

wherein m is 0 or 1, X is chlorine, bromine, or iodine, and n, e, and f are each, independently of the others, integers wherein e may be 0 and n and f are each at least 1, said process comprising providing a first reaction mixture which comprises a first solvent, a compound of the formula

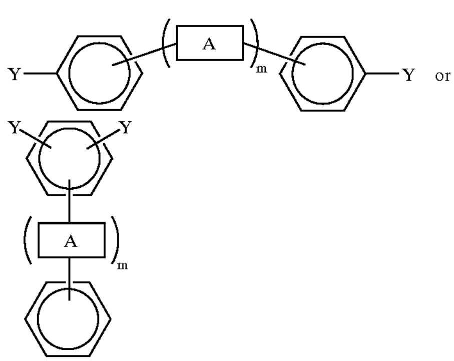

wherein Y is a chlorine or fluorine atom, a compound of the formula

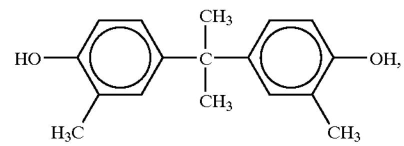

and optionally, a compound of the formula

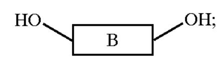

heating the first reaction mixture and removing generated water therefrom, thereby forming an intermediate polymer of the formula

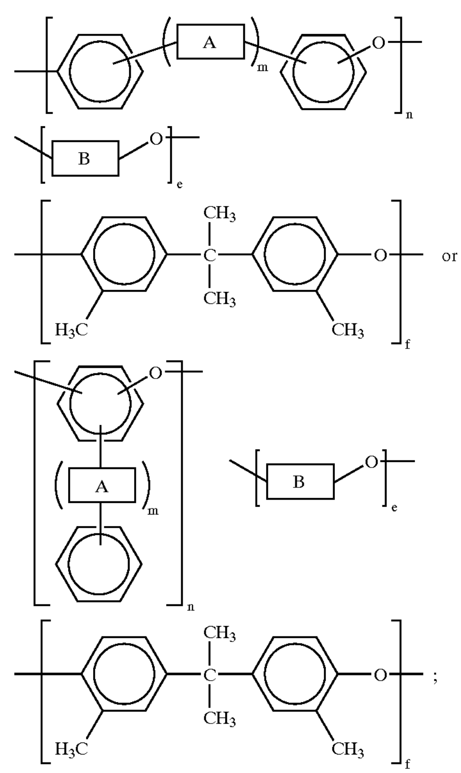

providing a second reaction mixture which comprises a second solvent, the intermediate polymer, and a N-halosuccinimide, wherein the halogen atom in the N-halosuccinimide is the same as the halogen atom that is X; and heating the second reaction mixture, thereby forming the polymer.

Copending application U.S. Ser. No. 10/040,850, filed Jan. 9, 2002, entitled "Process for Preparing Polyarylene Ethers," with the named inventors Timothy P. Bender, Christine DeVisser, Richard A. Burt, Paul F. Smith, and Marko D. Saban, the disclosure of which is totally incorporated herein by reference, discloses a process for preparing a polymer of the formula

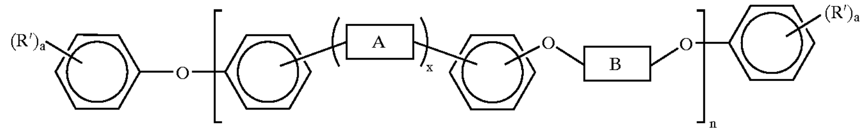

or

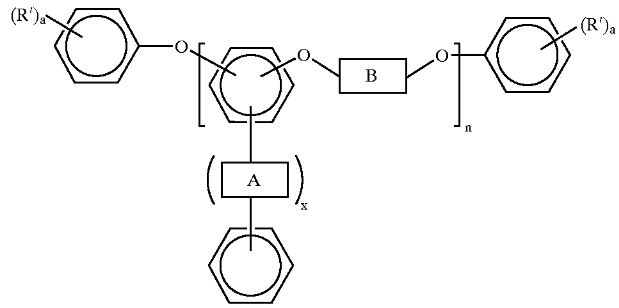

wherein x is an integer of 0 or 1, A is one of several specified groups, such as

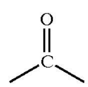

B is one of several specified groups, such as

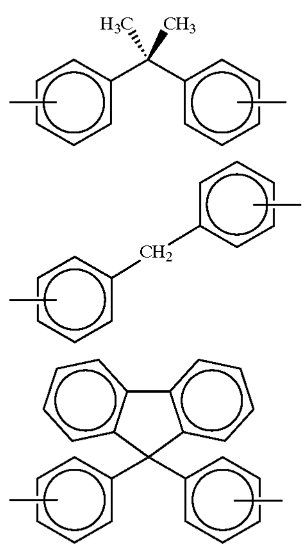

or mixtures thereof, and n is an integer representing the number of repeating monomer units, said process comprising (A) providing a reaction mixture which comprises (i) a solvent, (ii) a compound of the formula

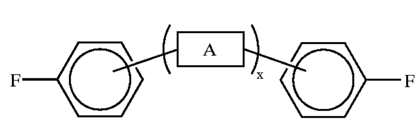

or

-continued

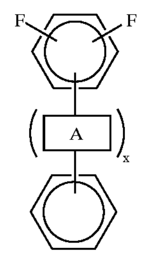

, (iii) a compound of the formula

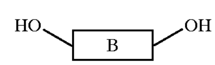

(iv) a compound of the formula

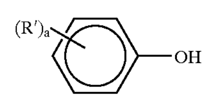

wherein a is an integer of from 1 to 5, R' is a hydrogen atom, an alkyl group, an aryl group, an arylalkyl group, an alkylaryl group, an alkoxy group, an aryloxy group, an arylalkyloxy group, an alkylaryloxy group, a polyalkyleneoxy group, or a mixture thereof, and (v) a carbonate base; and (B) heating the reaction mixture and removing generated water from the reaction mixture, thereby effecting a polymerization reaction.

Copending application U.S. Ser. No. 10/036,469, filed Jan. 7, 2002, entitled "High Performance Curable Polymers and Processes for the Preparation Thereof," with the named inventors Ram S. Narang and Timothy J. Fuller, the disclosure of which is totally incorporated herein by reference, discloses a composition which comprises a polymer containing at least some monomer repeat units with photosensitivity-imparting substituents which enable crosslinking or chain extension of the polymer upon exposure to actinic radiation, said polymer being of the formula

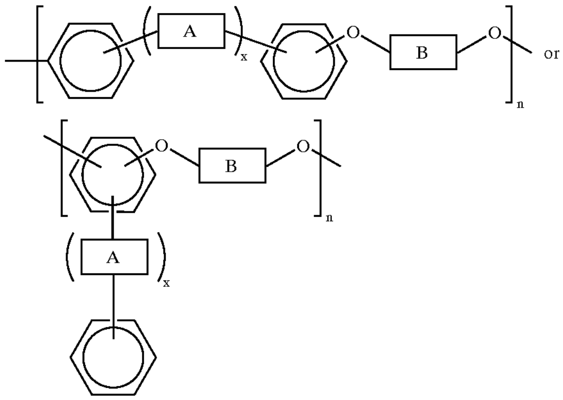

wherein x is an integer of 0 or 1, A is one of several specified groups, such as

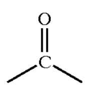

B is one of several specified groups, such as

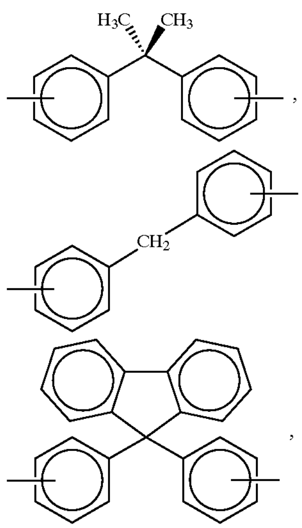

or mixtures thereof, and n is an integer representing the number of repeating monomer units, wherein said photosensitivity-imparting substituents are allyl ether groups, epoxy groups, or mixtures thereof. Also disclosed are a process for preparing a thermal ink jet printhead containing the aforementioned polymers and processes for preparing the aforementioned polymers.

BACKGROUND

Disclosed herein are methods for preparing high performance photosensitive polyarylene ether polymers. More specifically, disclosed herein are methods for preparing high performance photosensitive polyarylene ether polymers from haloalkylated intermediate polymers, wherein the resulting photosensitive polymers have a desirably low halogen content and, when cured, exhibit a desirably low crosslink density. One embodiment is directed to a polymer of the formula

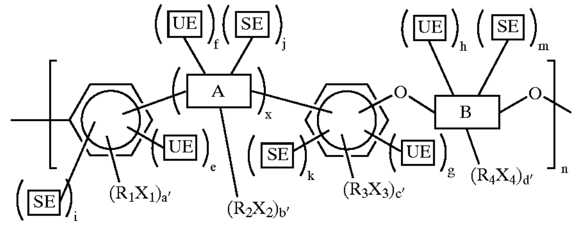

or

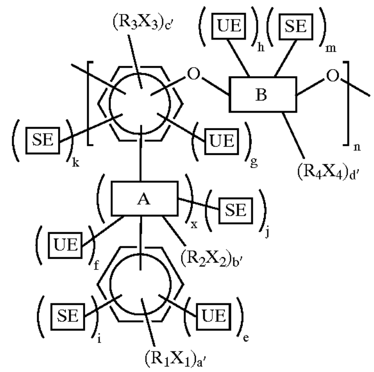

wherein x is an integer of 0 or 1, n is an integer representing the number of repeating monomer units, each of $R_1$, $R_2$, $R_3$, and $R_4$, independently of the others, is an alkyl group, an aryl group, an arylalkyl group, or an alkylaryl group, each of $X_1$, $X_2$, $X_3$, and $X_4$, independently of the others, is a halogen atom, a', b', c', and d' are each, independently of the others, integers of 0, 1, 2, 3, or 4, each UE group, independently of the others, is an unsaturated ester group, e, f, g, and h are each, independently of the others, integers of 0, 1, 2, 3, or 4, provided that at least one of e, f, g, and h is equal to or greater than 1 in at least some of the monomer repeat units of the polymer, each SE group, independently of the others, is a saturated ester group, and i, j, k, and m are each, independently of the others, integers of 0, 1, 2, 3, or 4, provided that at least one of i, j, k, and m is equal to or greater than 1 in at least some of the monomer repeat units of the polymer, provided that the sum of a'+e+i is less than or equal to 4, provided that the sum of b'+f+j is less than or equal to 4, provided that the sum of c'+g+k is less than or equal to 4, and provided that the sum of d'+h+m is less than or equal to 4, A is

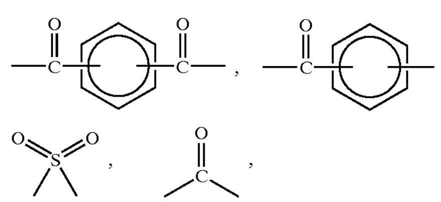

-continued
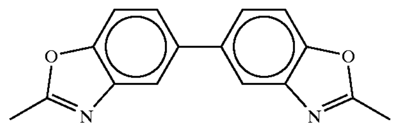
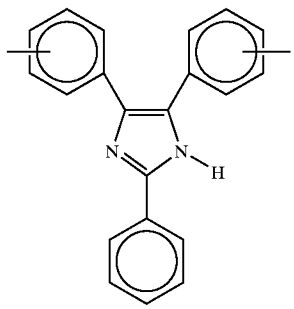
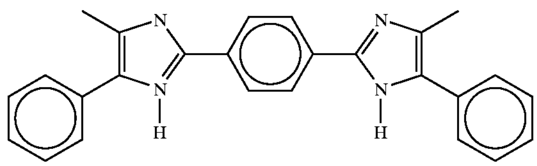
—O— , —C(CH$_3$)$_2$— ,
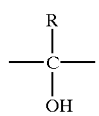
wherein R is a hydrogen atom, an alkyl group, an aryl group, an arylalkyl group, an alkylaryl group, or mixtures thereof,
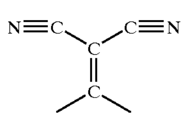
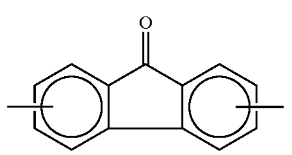
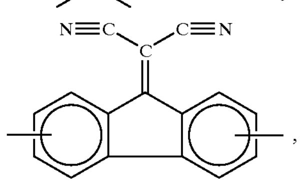
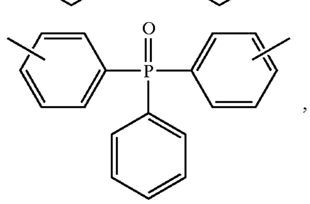
or mixtures thereof, B is
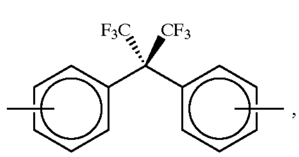
-continued
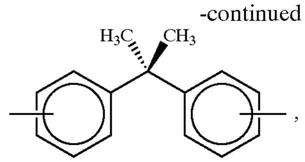
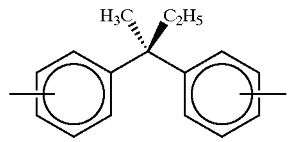
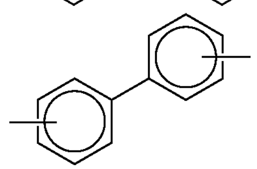
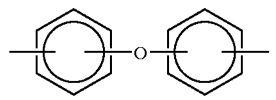
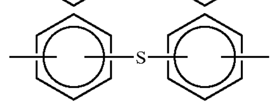
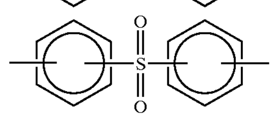
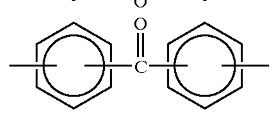
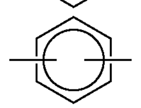
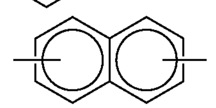
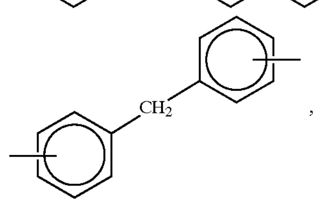
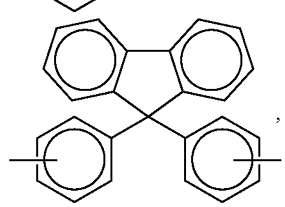
, —(CH$_2$)$_v$— ,
wherein v is an integer of from 1 to about 20,
—(CH$_2$O)$_t$—
wherein t is an integer of from 1 to about 20,
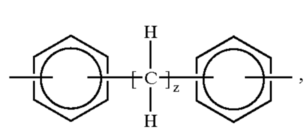
wherein z is an integer of from 2 to about 20,

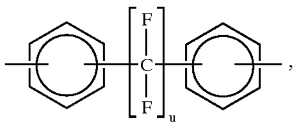
wherein u is an integer of from 1 to about 20,
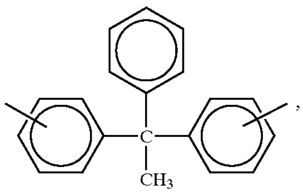
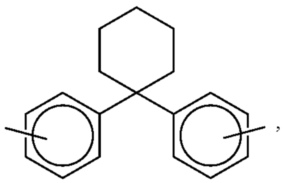
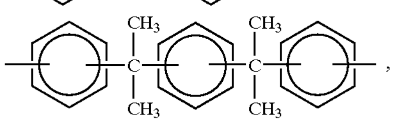
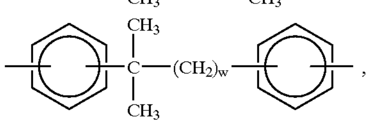
wherein w is an integer of from 1 to about 20,
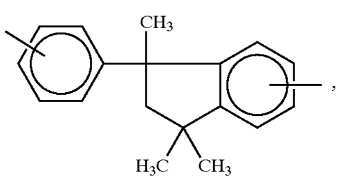
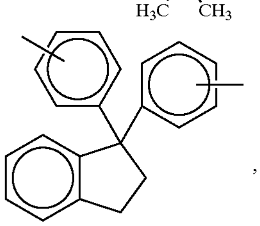
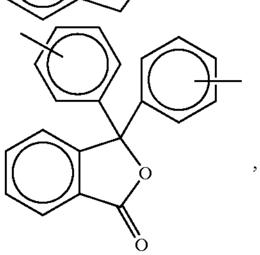
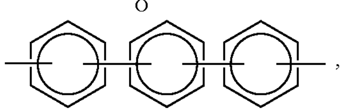
-continued
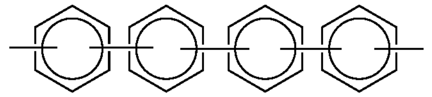
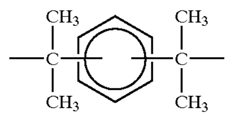
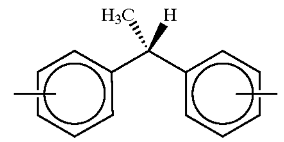
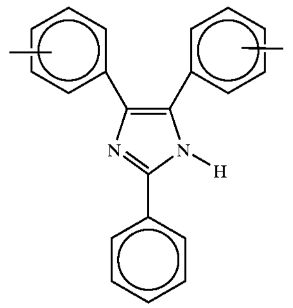
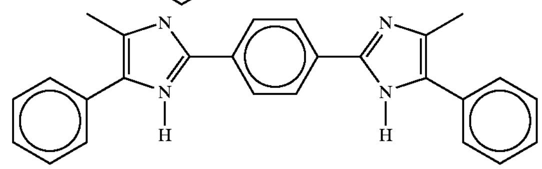
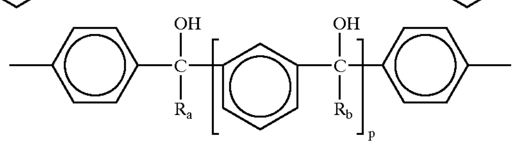
wherein $R_a$ and $R_b$ each, independently of the other, are hydrogen atoms, alkyl groups, aryl groups, arylalkyl groups, alkylaryl groups, or mixtures thereof, and p is an integer of 0 or 1,
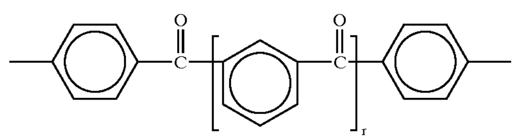
wherein r is an integer of 0 or 1,
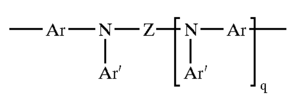
wherein (1) Z is
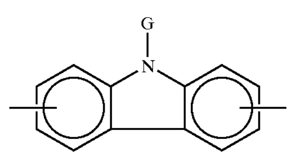

-continued

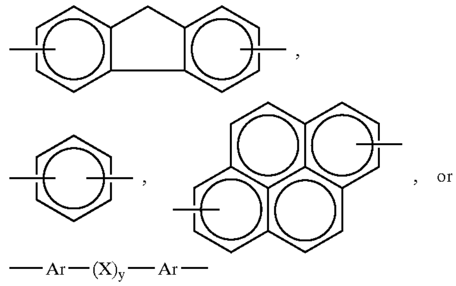

wherein y is o or 1; (2) Ar is

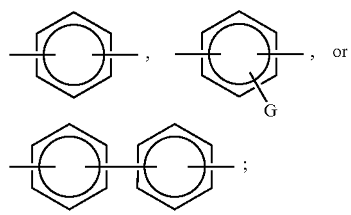

(3) G is an alkyl group selected from alkyl or isoalkyl groups containing from about 2 to about 10 carbon atoms; (4) Ar' is

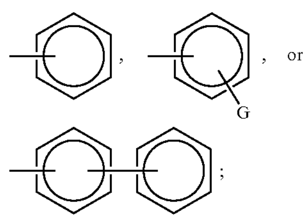

(5) X is

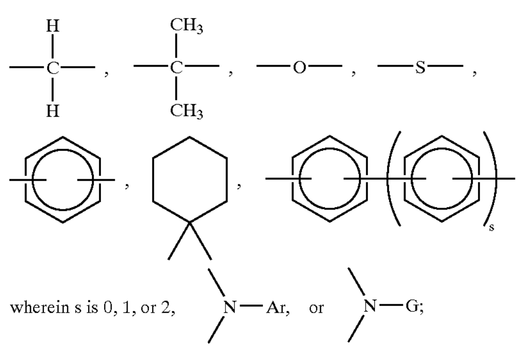

and (6) q is 0 or 1; or mixtures thereof, wherein RX represents the total number of haloalkyl groups in the polymer and is the sum of all $R_1X_1$ groups+all $R_2X_2$ groups+all $R_3X_3$ groups+all $R_4X_4$ groups, and wherein the ratio of unsaturated groups to saturated groups to RX groups in the polymer is represented by $$\upsilon\epsilon:\sigma\epsilon:\rho\chi$$

wherein $\upsilon\epsilon$ is from about 1 to about 99.99, wherein $\sigma\epsilon$ is from about 0.01 to about 99, wherein $\rho\chi$ is from 0 to about 50, and wherein $\upsilon\epsilon+\sigma\epsilon+\rho\chi=100$. Another embodiment is directed to a process for preparing a photosensitive polymer which comprises reacting a haloalkylated precursor polymer of the formula

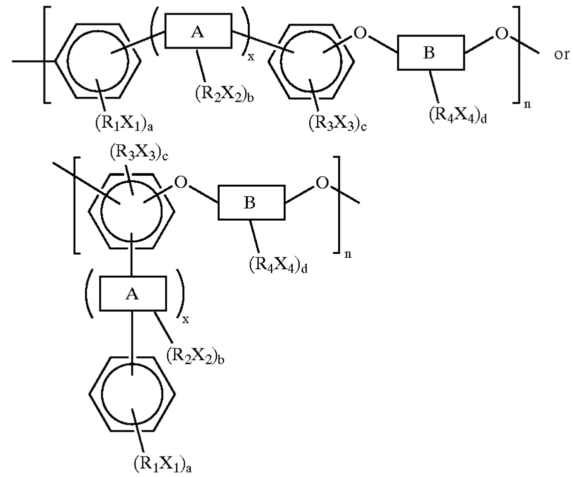

wherein x is an integer of 0 or 1, n is an integer representing the number of repeating monomer units, each of $R_1$, $R_2$, $R_3$, and $R_4$, independently of the others, is an alkyl group, an aryl group, an arylalkyl group, or an alkylaryl group, each of $X_1$, $X_2$, $X_3$, and $X_4$, independently of the others, is a halogen atom, a, b, c, and d are each integers of 0, 1, 2, 3, or 4, provided that at least one of a, b, c, and d is equal to or greater than 1 in at least some of the monomer repeat units of the polymer, A is

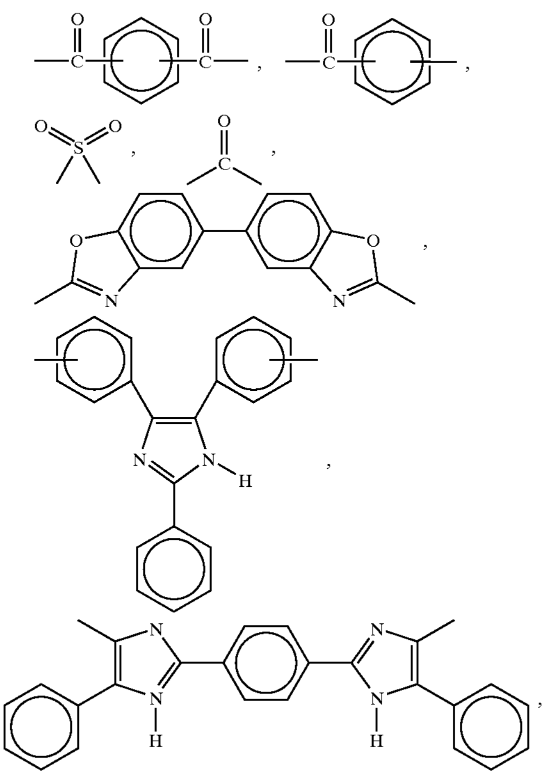

-continued
$-O-$, $-C(CH_3)_2-$, 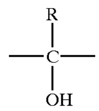
wherein R is a hydrogen atom, an alkyl group, an aryl group, an arylalkyl group, an alkylaryl group, or mixtures thereof,
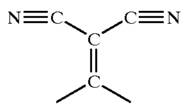, 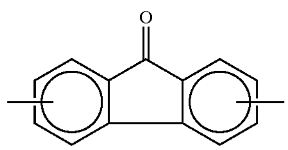,
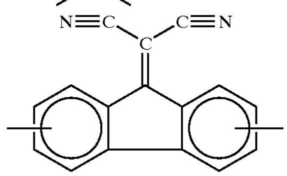,
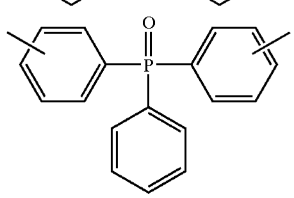,
or mixtures thereof, B is
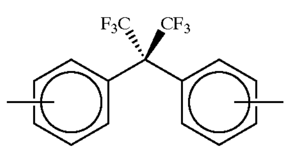,
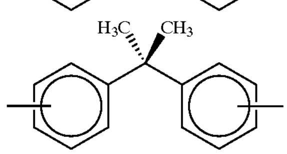,
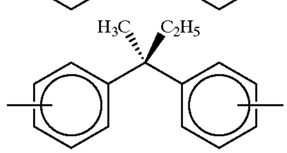,
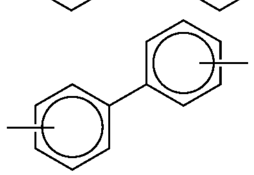,
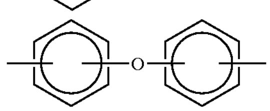,
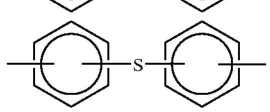,
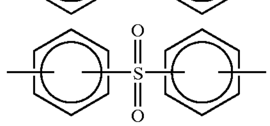,
-continued
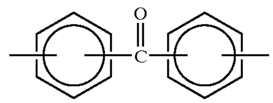,
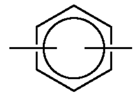, 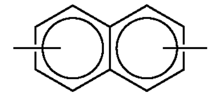,
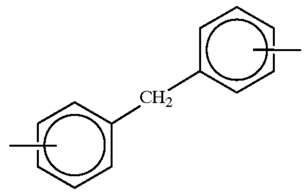,
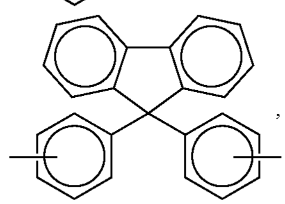, $-(CH_2)_v-$,
wherein v is an integer of from 1 to about 20,
$-(CH_2O)_t-$
wherein t is an integer of from 1 to about 20,
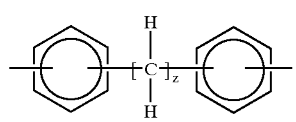,
wherein z is an integer of from 2 to about 20,
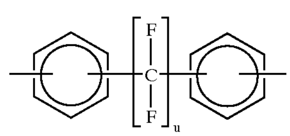,
wherein u is an integer of from 1 to about 20,
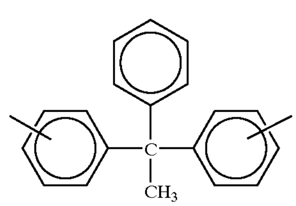,
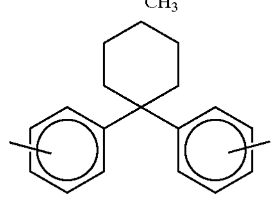, -continued
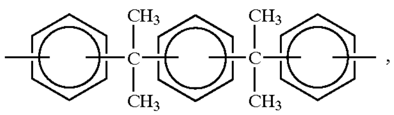
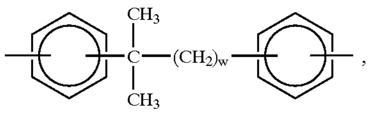
wherein w is an integer of from 1 to about 20,
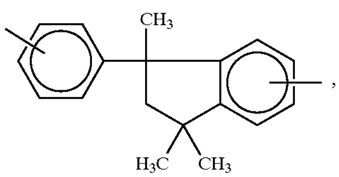
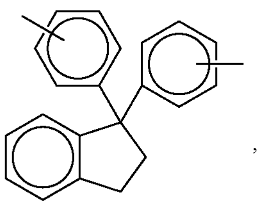
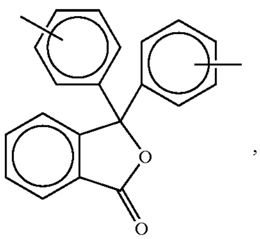
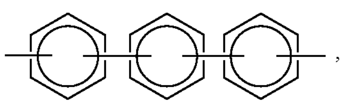
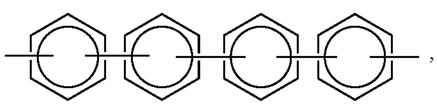
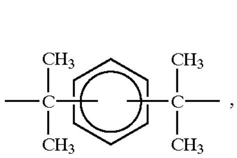
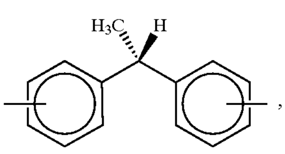
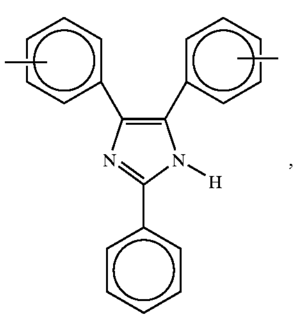
-continued
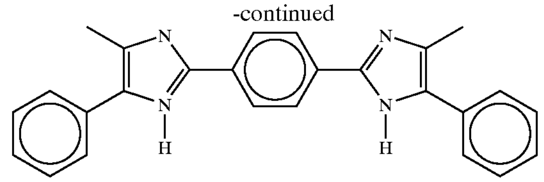
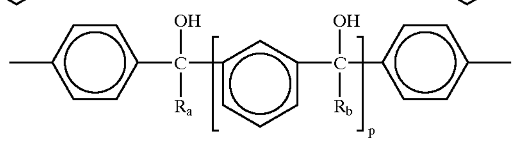
wherein $R_a$ and $R_b$ each, independently of the other, are hydrogen atoms, alkyl groups, aryl groups, arylalkyl groups, alkylaryl groups, or mixtures thereof, and p is an integer of 0 or 1,
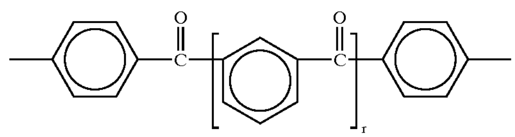
wherein r is an integer of 0 or 1,
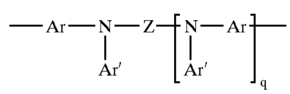
wherein (1) Z is
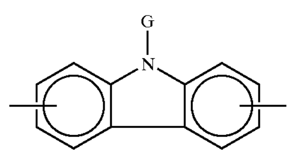
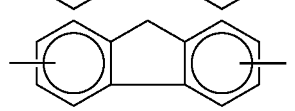
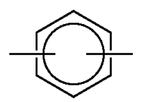
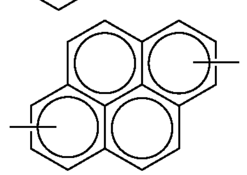
or
—Ar—$(X)_y$—Ar—
wherein y is 0 or 1; (2) Ar is
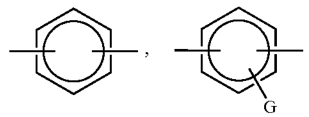
or -continued

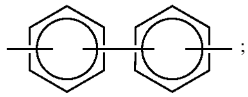

(3) G is an alkyl group selected from alkyl or isoalkyl groups containing from about 2 to about 10 carbon atoms; (4) Ar' is

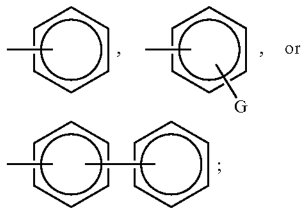

(5) X is

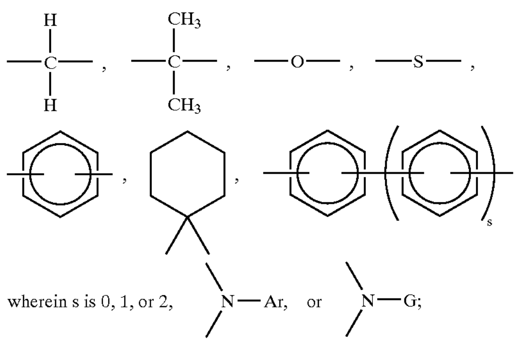

and (6) q is 0 or 1; or mixtures thereof, with an unsaturated ester salt and a saturated ester salt, thereby forming a curable polymer of the formula

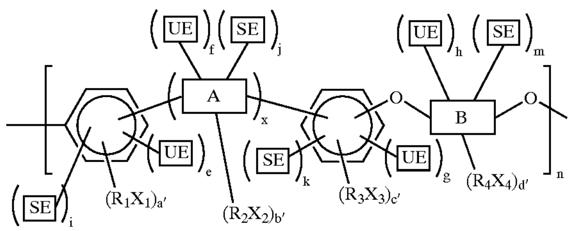

or

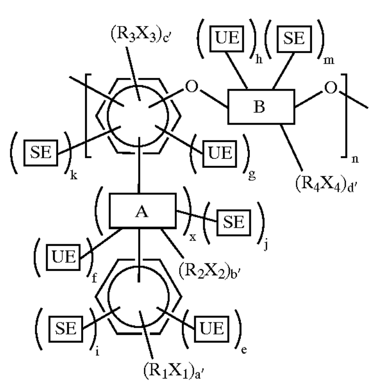

wherein a', b', c', and d' are each, independently of the others, integers of 0, 1, 2, 3, or 4, each UE group, independently of the others, is an unsaturated ester group corresponding to the unsaturated ester salt, e, f, g, and h are each, independently of the others, integers of 0, 1, 2, 3, or 4, provided that at least one of e, f, g, and h is equal to or greater than 1 in at least some of the monomer repeat units of the polymer, each SE group, independently of the others, is a saturated ester group corresponding to the saturated ester salt, and i, j, k, and m are each, independently of the others, integers of 0, 1, 2, 3, or 4, provided that at least one of i, j, k, and m is equal to or greater than 1 in at least some of the monomer repeat units of the polymer, provided that the sum of a'+e+i is less than or equal to 4, provided that the sum of b'+f+j is less than or equal to 4, provided that the sum of c'+g+k is less than or equal to 4, and provided that the sum of d'+h+m is less than or equal to 4, wherein RX represents the total number of haloalkyl groups in the polymer and is the sum of all $R_1X_1$ groups+all $R_2X_2$ groups+all $R_3X_3$ groups+all $R_4X_4$ groups, wherein the ratio of unsaturated ester salt to saturated ester salt is selected so that in the resulting polymer the ratio of unsaturated ester groups to saturated ester groups to RX groups in the polymer is represented by $$\upsilon\epsilon:\sigma\epsilon:\rho\chi$$

wherein $\upsilon\epsilon$ is from about 1 to about 99.99, wherein $\sigma\epsilon$ is from about 0.01 to about 99, wherein $\rho\chi$ is from 0 to about 50, and wherein $\upsilon\epsilon:\sigma\epsilon:\rho\chi=100$.

In microelectronics applications, there is a great need for low dielectric constant, high glass transition temperature, thermally stable, photopatternable polymers for use as interlayer dielectric layers and as passivation layers which protect microelectronic circuitry. Poly(imides) are widely used to satisfy these needs; these materials, however, have disadvantageous characteristics such as relatively high water sorption and hydrolytic instability. There is thus a need for high performance polymers which can be effectively photopatterned and developed at high resolution.

Polyarylene ethers are known polymers for use as high performance engineering thermoplastics. They exhibit outstanding physical properties and high chemical resistance. The use of these materials as photoresists when substituted with photoactive substituents is also known. These materials are suitable for use in applications such as thermal ink jet printheads, other microelectronics applications, printed circuit boards, lithographic printing processes, interlayer dielectrics, and the like.

U.S. Pat. No. 5,994,425 (Narang et al.), U.S. Pat. No. 6,022,095 (Narang et al.), EP 827027, and JP 10120743, the disclosures of each of which are totally incorporated herein by reference, disclose an improved composition comprising a photopatternable polymer containing at least some monomer repeat units with photosensitivity-imparting substituents, said photopatternable polymer being of the general formula

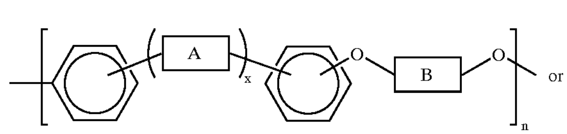

-continued

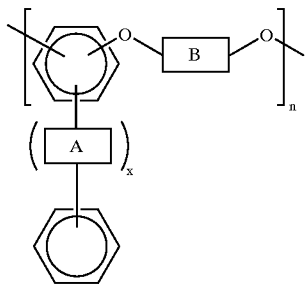

wherein x is an integer of 0 or 1, A is one of several specified groups, such as

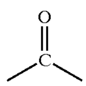

B is one of several specified groups, such as

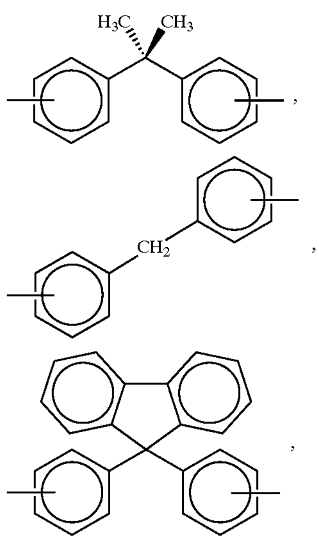

or mixtures thereof, and n is an integer representing the number of repeating monomer units. Also disclosed is a process for preparing a thermal ink jet printhead with the aforementioned polymer and a thermal ink jet printhead containing therein a layer of a crosslinked or chain extended polymer of the above formula.

U.S. Pat. No. 5,849,809 (Narang et al.), U.S. Pat. No. 6,203,143 (Narang et al.), EP 827028, and JP 10090895, the disclosures of each of which are totally incorporated herein by reference, disclose a composition which comprises (a) a polymer containing at least some monomer repeat units with photosensitivity-imparting substituents which enable crosslinking or chain extension of the polymer upon exposure to actinic radiation, said polymer being of the formula

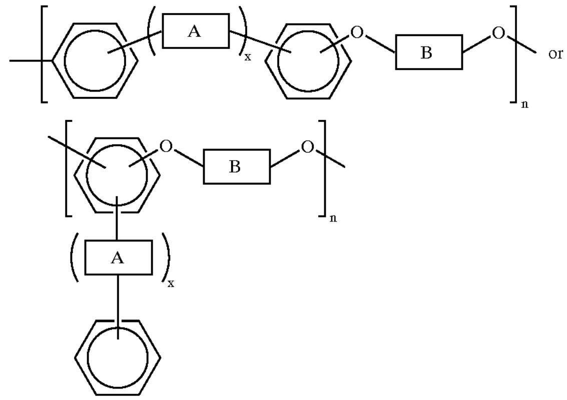

wherein x is an integer of 0 or 1, A is one of several specified groups, such as

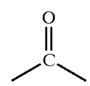

B is one of several specified groups, such as

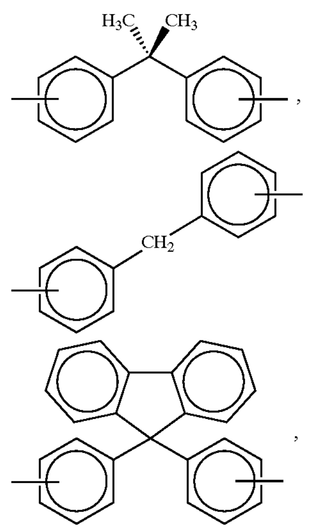

or mixtures thereof, and n is an integer representing the number of repeating monomer units, wherein said photosensitivity-imparting substituents are hydroxyalkyl groups; (b) at least one member selected from the group consisting of photoinitiators and sensitizers; and (c) an optional solvent. Also disclosed are processes for preparing the above polymers and methods of preparing thermal ink jet printheads containing the above polymers.

U.S. Pat. No. 6,124,372 (Smith et al.), U.S. Pat. No. 6,151,042 (Smith et al.), U.S. Pat. No. 6,323,301 (Smith et al.), EP 827029, and JP 10097073, the disclosures of each of which are totally incorporated herein by reference, disclose a composition comprising a polymer with a weight average molecular weight of from about 1,000 to about 100,000, said polymer containing at least some monomer repeat units with a first, photosensitivity-imparting substituent which enables crosslinking or chain extension of the polymer upon exposure to actinic radiation, said polymer also containing a second, thermal sensitivity-imparting substituent which enables further crosslinking or chain extension of the polymer upon exposure to temperatures of about 140° C. and higher, wherein the first substituent is not the same as the second substituent, said polymer being selected from the group consisting of polysulfones, polyphenylenes, polyether sulfones, polyimides, polyamide imides, polyarylene ethers, polyphenylene sulfides, polyarylene ether ketones, phenoxy resins, polycarbonates, polyether imides, polyquinoxalines, polyquinolines, polybenzimidazoles, polybenzoxazoles, polybenzothiazoles, polyoxadiazoles, copolymers thereof, and mixtures thereof.

U.S. Pat. No. 5,889,077 (Fuller et al.), U.S. Pat. No. 6,087,414 (Fuller et al.), EP 827030, and JP 10090894, the disclosures of each of which are totally incorporated herein by reference, disclose a process which comprises reacting a polymer of the general formula

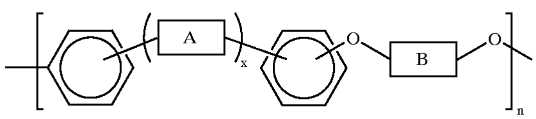

or

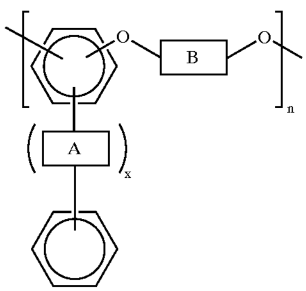

wherein x is an integer of 0 or 1, A is one of several specified groups, such as

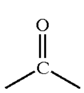

B is one of several specified groups, such as

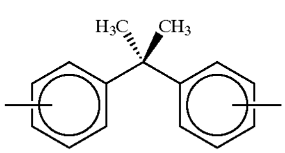

,

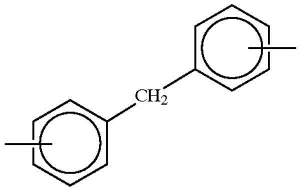

,

-continued

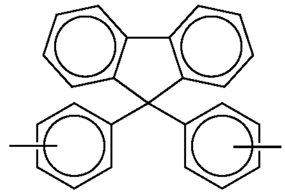

, or mixtures thereof, and n is an integer representing the number of repeating monomer units, with (i) a formaldehyde source, and (ii) an unsaturated acid in the presence of an acid catalyst, thereby forming a curable polymer with unsaturated ester groups. Also disclosed is a process for preparing an ink jet printhead with the above polymer.

U.S. Pat. No. 5,739,254 (Fuller et al.), U.S. Pat. No. 5,753,783 (Fuller et al.), EP 826700, and JP 10087817, the disclosures of each of which are totally incorporated herein by reference, disclose a process which comprises reacting a polymer of the general formula

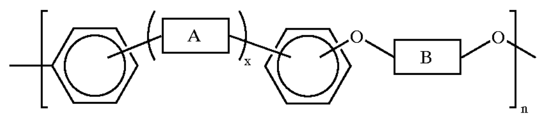

or

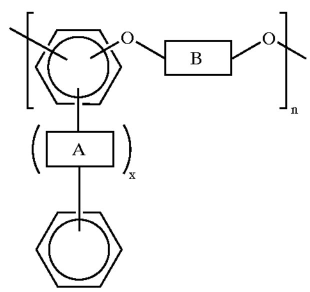

wherein x is an integer of 0 or 1, A is one of several specified groups, such as

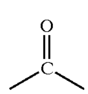

B is one of several specified groups, such as

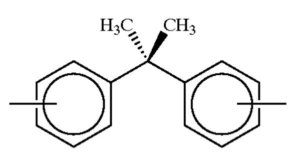

,

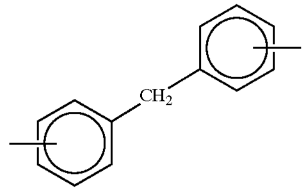

,

-continued

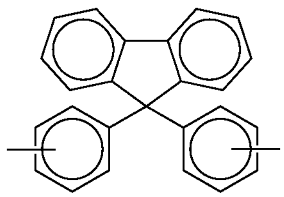

or mixtures thereof, and n is an integer representing the number of repeating monomer units, with an acetyl halide and dimethoxymethane in the presence of a halogen-containing Lewis acid catalyst and methanol, thereby forming a haloalkylated polymer. In a specific embodiment, the haloalkylated polymer is then reacted further to replace at least some of the haloalkyl groups with photosensitivity-imparting groups. Also disclosed is a process for preparing a thermal ink jet printhead with the aforementioned polymer.

U.S. Pat. No. 5,761,809 (Fuller et al.), EP 827026, and JP 10090896, the disclosures of each of which are totally incorporated herein by reference, disclose a process which comprises reacting a haloalkylated aromatic polymer with a material selected from the group consisting of unsaturated ester salts, alkoxide salts, alkylcarboxylate salts, and mixtures thereof, thereby forming a curable polymer having functional groups corresponding to the selected salt. Another embodiment is directed to a process for preparing an ink jet printhead with the curable polymer thus prepared.

U.S. Pat. No. 5,958,995 (Narang et al.), U.S. Pat. No. 6,184,263 (Narang et al.), EP 827031, and JP 10104836, the disclosures of each of which are totally incorporated herein by reference, disclose a composition which comprises a mixture of (A) a first component comprising a polymer, at least some of the monomer repeat units of which have at least one photosensitivity-imparting group thereon, said polymer having a first degree of photosensitivity-imparting group substitution measured in milliequivalents of photosensitivity-imparting group per gram and being of the general formula

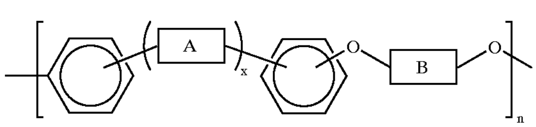

or

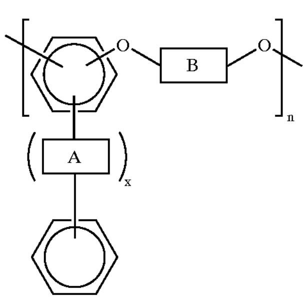

wherein x is an integer of 0 or 1, A is one of several specified groups, such as

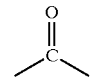

B is one of several specified groups, such as

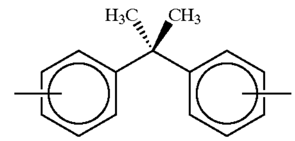

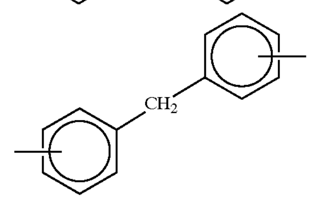

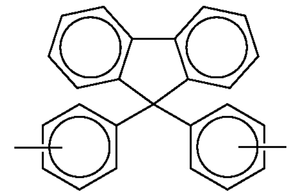

or mixtures thereof, and n is an integer representing the number of repeating monomer units, and (B) a second component which comprises either (1) a polymer having a second degree of photosensitivity-imparting group substitution measured in milliequivalents of photosensitivity-imparting group per gram lower than the first degree of photosensitivity-imparting group substitution, wherein said second degree of photosensitivity-imparting group substitution may be zero, wherein the mixture of the first component and the second component has a third degree of photosensitivity-imparting group substitution measured in milliequivalents of photosensitivity-imparting group per gram which is lower than the first degree of photosensitivity-imparting group substitution and higher than the second degree of photosensitivity-imparting group substitution, or (2) a reactive diluent having at least one photosensitivity-imparting group per molecule and having a fourth degree of photosensitivity-imparting group substitution measured in milliequivalents of photosensitivity-imparting group per gram, wherein the mixture of the first component and the second component has a fifth degree of photosensitivity-imparting group substitution measured in milliequivalents of photosensitivity-imparting group per gram which is higher than the first degree of photosensitivity-imparting group substitution and lower than the fourth degree of photosensitivity-imparting group substitution; wherein the weight average molecular weight of the mixture is from about 10,000 to about 50,000; and wherein the third or fifth degree of photosensitivity-imparting group substitution is from about 0.25 to about 2 milliequivalents of photosensitivity-imparting groups per gram of mixture. Also disclosed is a process for preparing a thermal ink jet printhead with the aforementioned composition.

U.S. Pat. No. 5,945,253 (Narang et al.), U.S. Pat. No. 6,365,323 (Narang et al.), EP 827033, and JP 10090897, the disclosures of each of which are totally incorporated herein by reference, disclose a composition which comprises a polymer containing at least some monomer repeat units with photosensitivity-imparting substituents which enable crosslinking or chain extension of the polymer upon exposure to actinic radiation, said polymer being of the formula

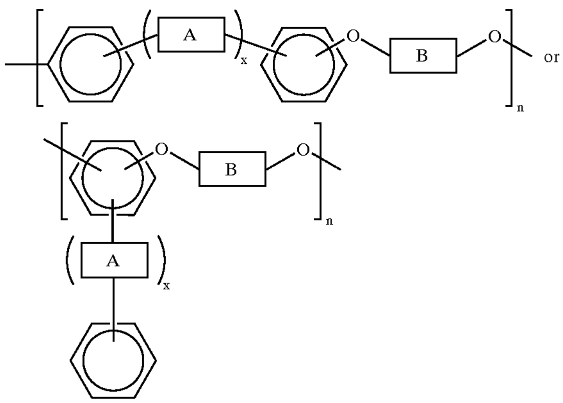

wherein x is an integer of 0 or 1, A is one of several specified groups, such as

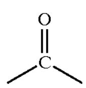

B is one of several specified groups, such as

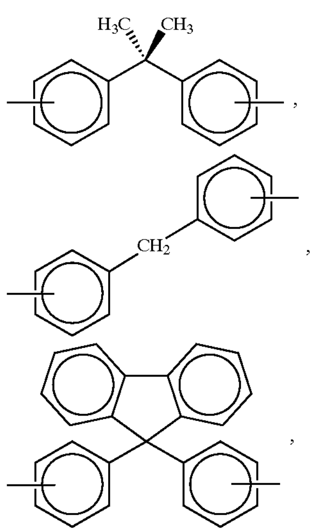

or mixtures thereof, and n is an integer representing the number of repeating monomer units, wherein said photosensitivity-imparting substituents are allyl ether groups, epoxy groups, or mixtures thereof. Also disclosed are a process for preparing a thermal ink jet printhead containing the aforementioned polymers and processes for preparing the aforementioned polymers.

U.S. Pat. No. 5,863,963 (Narang et al.), U.S. Pat. No. 6,090,453 (Narang et al.), and JP 10090899, the disclosures of each of which are totally incorporated herein by reference, disclose a process which comprises the steps of (a) providing a polymer containing at least some monomer repeat units with halomethyl group substituents which enable crosslinking or chain extension of the polymer upon exposure to a radiation source which is electron beam radiation, x-ray radiation, or deep ultraviolet radiation, said polymer being of the formula

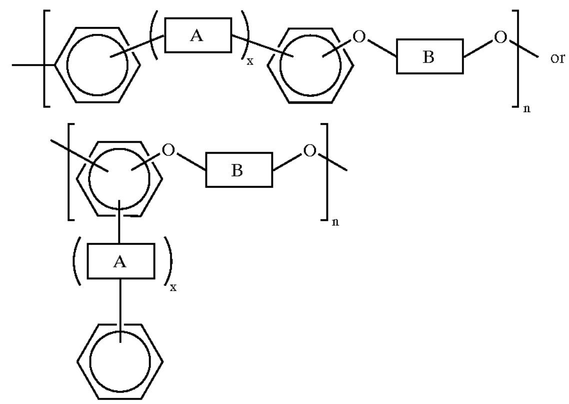

wherein x is an integer of 0 or 1, A is one of several specified groups, such as

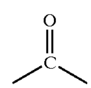

B is one of several specified groups, such as

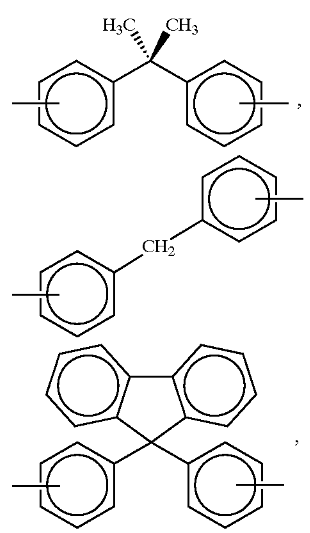

or mixtures thereof, and n is an integer representing the number of repeating monomer units, and (b) causing the polymer to become crosslinked or chain extended through the photosensitivity-imparting groups. Also disclosed is a process for preparing a thermal ink jet printhead by the aforementioned curing process.

U.S. Pat. No. 6,007,877 (Narang et al.), U.S. Pat. No. 6,273,543 (Narang et al.), EP 827032, and JP 10090898, the disclosures of each of which are totally incorporated herein by reference, disclose a composition which comprises a polymer containing at least some monomer repeat units with water-solubility- or water-dispersability-imparting substituents and at least some monomer repeat units with photosensitivity-imparting substituents which enable crosslinking or chain extension of the polymer upon exposure to actinic radiation, said polymer being of the formula

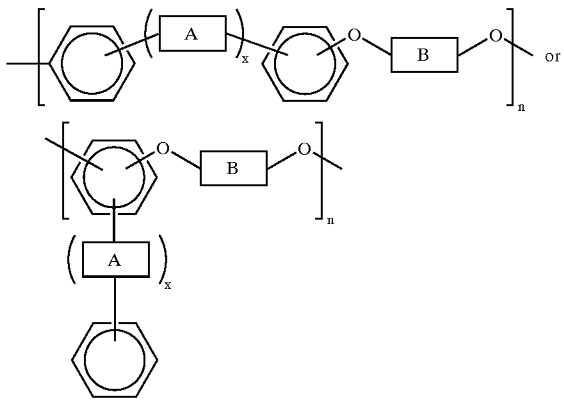

wherein x is an integer of 0 or 1, A is one of several specified groups, such as

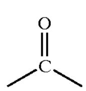

B is one of several specified groups, such as

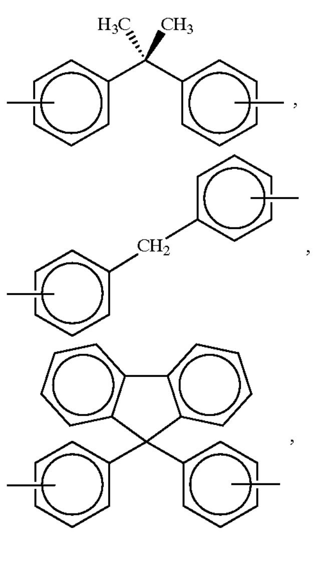

or mixtures thereof, and n is an integer representing the number of repeating monomer units. In one embodiment, a single functional group imparts both photosensitivity and water solubility or dispersability to the polymer. In another embodiment, a first functional group imparts photosensitivity to the polymer and a second functional group imparts water solubility or dispersability to the polymer. Also disclosed is a process for preparing a thermal ink jet printhead with the aforementioned polymers.

U.S. Pat. No. 5,814,426 (Fuller et al.), EP 918257, and JP 11218943, the disclosures of each of which are totally incorporated herein by reference, disclose an imaging member which comprises a conductive substrate, a photogenerating material, and a binder which comprises a polymer of the formulae I, II, III, IV, V, VI, VII, VIII, IX, or X as further defined therein.

U.S. Pat. No. 5,882,814 (Fuller et al.), EP 918256, and JP 11223956, the disclosures of each of which are totally incorporated herein by reference, disclose an imaging member which comprises a conductive substrate, a photogenerating layer, and a charge transport layer comprising a polymer of the formulae I, II, III, IV, V, VI, VII, VIII, IX, or X as further defined therein.

U.S. Pat. No. 5,874,192 (Fuller et al.), EP 918258, and JP 11223955, the disclosures of each of which are totally incorporated herein by reference, disclose an imaging member which comprises a conductive substrate, a photogenerating material, a charge transport material, and a polymeric binder comprising (a) a first polymer comprising a polycarbonate, and (b) a second polymer of the formulae I, II, III, IV, V, VI, VII, VIII, IX, or X as further defined therein.

U.S. Pat. No. 6,273,985 (DeLouise et al.), the disclosure of which is totally incorporated herein by reference, discloses a process for bonding a first article to a second article which comprises (a) providing a first article comprising a polymer having photosensitivity-imparting substituents; (b) providing a second article comprising metal, plasma nitride, silicon, or glass; (c) applying to at least one of the first article and the second article an adhesion promoter selected from silanes, titanates, or zirconates having (i) alkoxy, aryloxy, or arylalkyloxy functional groups and (ii) functional groups including at least one photosensitive aliphatic $>C{=}C<$ linkage; (d) placing the first article in contact with the second article; and (e) exposing the first article, second article, and adhesion promoter to radiation, thereby bonding the first article to the second article with the adhesion promote. In one embodiment, the adhesion promoter is employed in microelectrical mechanical systems such as thermal ink jet printheads.

U.S. Pat. No. 6,260,956 (Narang et al.), the disclosure of which is totally incorporated herein by reference, discloses an ink jet printhead which comprises (i) an upper substrate with a set of parallel grooves for subsequent use as ink channels and a recess for subsequent use as a manifold, the grooves being open at one end for serving as droplet emitting nozzles, and (ii) a lower substrate in which one surface thereof has an array of heating elements and addressing electrodes formed thereon, said lower substrate having an insulative layer deposited on the surface thereof and over the heating elements and addressing electrodes and patterned to form recesses therethrough to expose the heating elements and terminal ends of the addressing electrodes, the upper and lower substrates being aligned, mated, and bonded together to form the printhead with the grooves in the upper substrate being aligned with the heating elements in the lower substrate to form droplet emitting nozzles, said upper substrate comprising a material formed by crosslinking or chain extending a polymer of formula I or II.

U.S. Pat. No. 6,117,967 (Fuller et al.) and JP 200119761, the disclosures of each of which are totally incorporated herein by reference, discloses a polymer of the formula

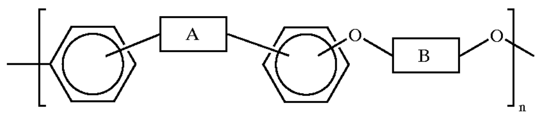

wherein A is

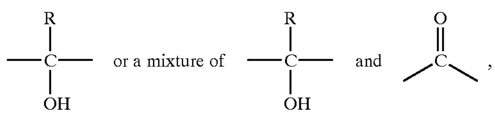

wherein R is a hydrogen atom, an alkyl group, an aryl group, or mixtures thereof, B is one of specified groups, such as

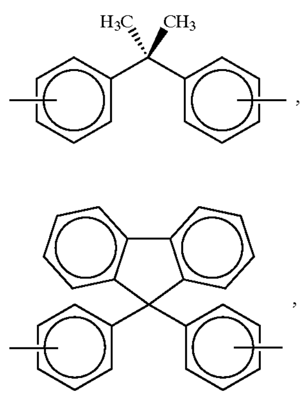

or mixtures thereof, and n is an integer representing the number of repeating monomer units.

U.S. Pat. No. 6,177,238 (Fuller et al.), the disclosure of which is totally incorporated herein by reference, discloses an ink jet printhead containing a polymer of the formula

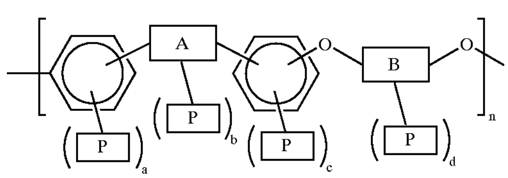

wherein P is a substituent which enables crosslinking of the polymer, a, b, c, and d are each integers of 0, 1, 2, 3, or 4, provided that at least one of a, b, c, and d is equal to or greater than 1 in at least some of the monomer repeat units of the polymer, A is

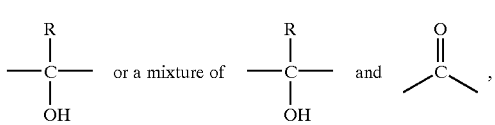

wherein R is a hydrogen atom, an alkyl group, an aryl group, or mixtures thereof, B is one of specified groups, such as

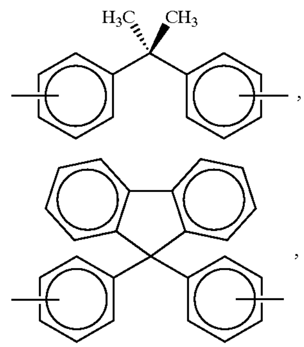

or mixtures thereof, and n is an integer representing the number of repeating monomer units.

U.S. Pat. No. 6,174,636 (Fuller et al.), the disclosure of which is totally incorporated herein by reference, discloses an imaging member which comprises a conductive substrate, a photogenerating material, and a binder comprising a polymer of the formula

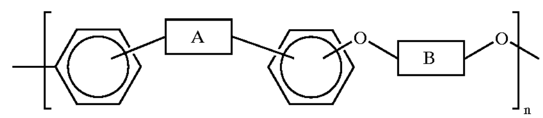

wherein A is

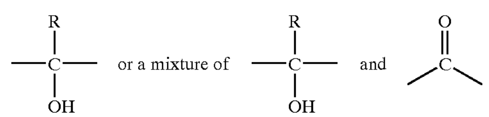

wherein R is a hydrogen atom, an alkyl group, an aryl group, or mixtures thereof, B is one of specified groups, such as

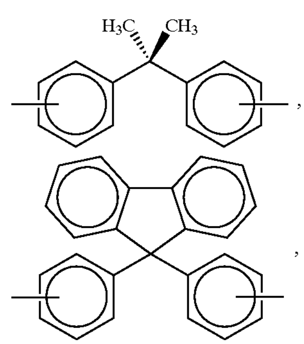

or mixtures thereof, and n is an integer representing the number of repeating monomer units.

U.S. Pat. No. 6,187,512 (Foucher et al.) and JP 2000344884, the disclosures of each of which are totally incorporated herein by reference, disclose a process which comprises reacting a polymer of the general formula

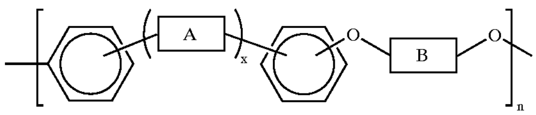
or

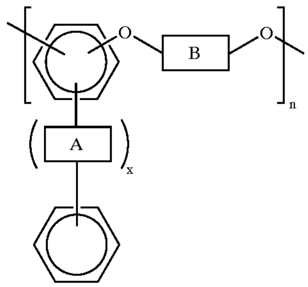

wherein x is an integer of 0 or 1, A is one of several specified groups, such as

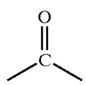
,

B is one of several specified groups, such as

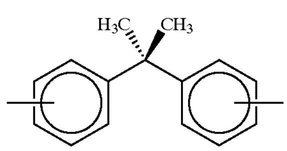
,

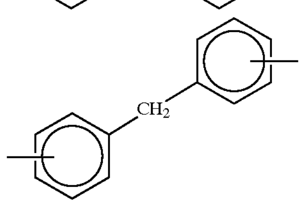
,

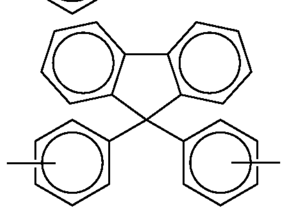
, or mixtures thereof, and n is an integer representing the number of repeating monomer units, with a halomethyl alkyl ether, an acetyl halide, and methanol in the presence of a halogen-containing Lewis acid catalyst, thereby forming a halomethylated polymer.

U.S. Pat. No. 6,020,119 (Foucher et al.), the disclosure of which is totally incorporated herein by reference, discloses a process which comprises reacting a polymer of the general formula

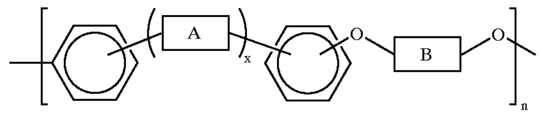
or

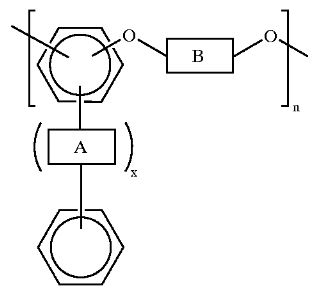

wherein x is an integer of 0 or 1, A is one of several specified groups, such as

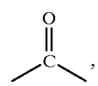
,

B is one of several specified groups, such as

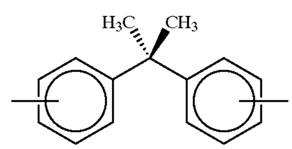
,

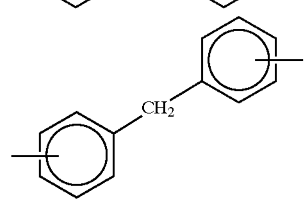
,

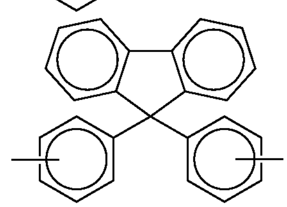
, or mixtures thereof, and n is an integer representing the number of repeating monomer units, with a halomethylethyl ether, a hydrohalic acid, and acetic acid in the presence of a halogen-containing Lewis acid catalyst, thereby forming a halomethylated polymer.

U.S. Pat. No. 6,139,920 (Smith et al.) and U.S. Pat. No. 6,260,949 (Smith et al.), the disclosures of each of which are totally incorporated herein by reference, disclose a composition comprising a blend of (a) a thermally reactive polymer selected from the group consisting of resoles, novolacs, thermally reactive polyarylene ethers, and mixtures thereof; and (b) a photoreactive epoxy resin that is photoreactive in the absence of a photocationic initiator.

U.S. Pat. No. 5,773,553 (Fuller et al.) and U.S. Pat. No. 5,869,595 (Fuller et al.), the disclosures of each of which are totally incorporated herein by reference, disclose a process which comprises reacting a polyimide precursor with borane. Also disclosed is a thermal ink jet printhead containing a layer comprising the product of this reaction.

U.S. Pat. No. 5,939,206 (Kneezel et al.) and JP 10100410, the disclosures of each of which are totally incorporated herein by reference, disclose an apparatus which comprises at least one semiconductor chip mounted on a substrate, said substrate comprising a porous, electrically conductive member having electrophoretically deposited thereon a coating of a polymeric material. In one embodiment, the semiconductor chips are thermal ink jet printhead subunits.

U.S. Pat. No. 6,485,130 (DeLouise et al.), the disclosure of which is totally incorporated herein by reference, discloses a process for bonding a first article to a second article which comprises (a) providing a first article comprising a polymer having photosensitivity-imparting substituents; (b) providing a second article comprising metal, plasma nitride, silicon, or glass; (c) applying to at least one of the first article and the second article an adhesion promoter selected from silanes, titanates, or zirconates having (i) alkoxy, aryloxy, or arylalkyloxy functional groups and (ii) functional groups including at least one photosensitive aliphatic >C═C< linkage; (d) placing the first article in contact with the second article; and (e) exposing the first article, second article, and adhesion promoter to radiation, thereby bonding the first article to the second article with the adhesion promote. In one embodiment, the adhesion promoter is employed in microelectrical mechanical systems such as thermal ink jet printheads.

While known compositions and processes are suitable for their intended purposes, a need remains for improved materials suitable for microelectronics applications. A need also remains for photopatternable polymeric materials which are heat stable, electrically insulating, and mechanically robust. Further, a need remains for photopatternable polymeric materials which exhibit low shrinkage during post-cure steps in microelectronic device fabrication processes. In addition, a need remains for photopatternable polymeric materials which exhibit a relatively long shelf life. There is also a need for photopatternable polymeric materials which can be patterned with relatively low photo-exposure energies. In addition, there is a need for photopatternable polymeric materials which, in the cured form, exhibit good solvent resistance. Further, there is a need for photopatternable polymeric materials which, when applied to microelectronic devices by spin casting techniques and cured, exhibit reduced edge bead and no apparent lips and dips. Additionally, there is a need for processes for preparing photopatternable polymeric materials with high aspect ratios at high resolutions by the incorporation of polymerizable groups and/or cross-linking sites pendant to the polymers. A need also remains for processes for preparing photopatternable polymers from intermediate polymers having halomethyl groups pendant to the polymer chains wherein the resulting photopatternable polymers exhibit a desirably low halogen content. In addition, a need remains for processes for preparing photopatternable polymers from intermediate polymers having halomethyl groups pendant to the polymer chains wherein the resulting photopatternable polymers, when cured, exhibit a desirably low crosslink density. Further, a need remains for processes for preparing photopatternable polymers from intermediate polymers having halomethyl groups pendant to the polymer chains wherein the synthesis of the photopatternable polymers takes place within a reasonably short period of time. Additionally, a need remains for processes for preparing photopatternable polymers from intermediate polymers having halomethyl groups pendant to the polymer chains wherein the resulting photopatternable polymer does not cause corrosion in unprotected parts of a microelectronic device. There is also a need for processes for preparing photopatternable polymers from intermediate polymers having halomethyl groups pendant to the polymer chains wherein the resulting photopatternable polymer does not cause corrosion in unprotected equipment used in the fabrication and processing of microelectronic devices. In addition, there is a need for processes for preparing photopatternable polymers from intermediate polymers having halomethyl groups pendant to the polymer chains wherein the formulation and processing of the photopatternable polymer does not result in unnecessary exposure of workers to residual hazardous chemicals such as chlorine gas.

SUMMARY

Disclosed herein is a polymer of the formula

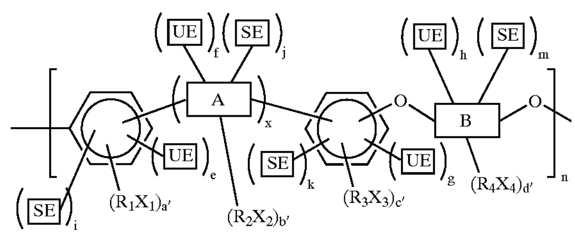

or

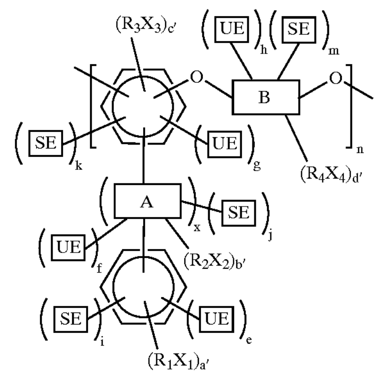

wherein x is an integer of 0 or 1, n is an integer representing the number of repeating monomer units, each of $R_1$, $R_2$, $R_3$, and $R_4$, independently of the others, is an alkyl group, an aryl group, an arylalkyl group, or an alkylaryl group, each of $X_1$, $X_2$, $X_3$, and $X_4$, independently of the others, is a halogen atom, a', b', c', and d' are each, independently of the others, integers of 0, 1, 2, 3, or 4, each UE group, independently of the others, is an unsaturated ester group, e, f, g, and h are each, independently of the others, integers of 0, 1, 2, 3, or 4, provided that at least one of e, f, g, and h is equal to or greater than 1 in at least some of the monomer repeat units of the polymer, each SE group, independently of the others, is a saturated ester group, and i, j, k, and m are each, independently of the others, integers of 0, 1, 2, 3, or 4, provided that at least one of i, j, k, and m is equal to or greater than 1 in at least some of the monomer repeat units of the polymer, provided that the sum of a'+e+i is less than or equal to 4, provided that the sum of b'+f+j is less than or equal to 4, provided that the sum of c'+g+k is less than or equal to 4, and provided that the sum of d'+h+m is less than or equal to 4, A is
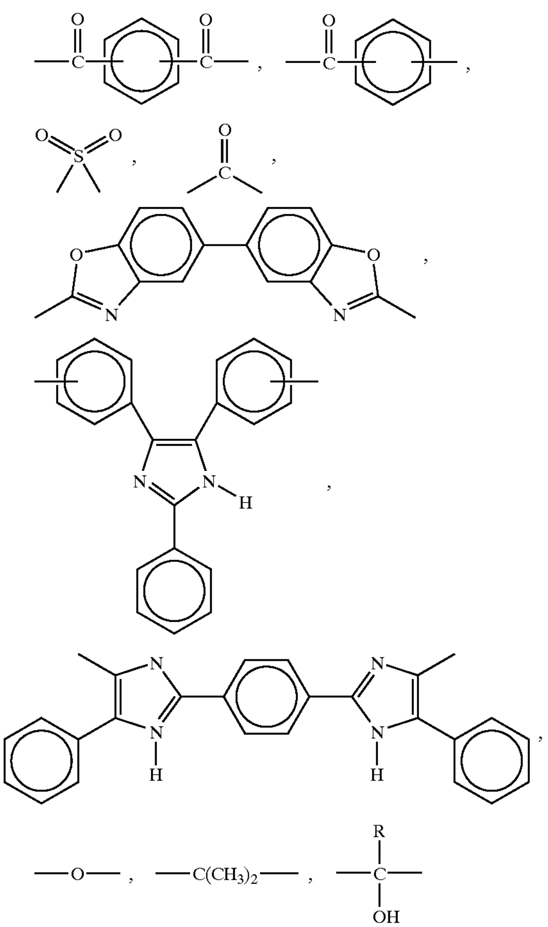
wherein R is a hydrogen atom, an alkyl group, an aryl group, an arylalkyl group, an alkylaryl group, or mixtures thereof,
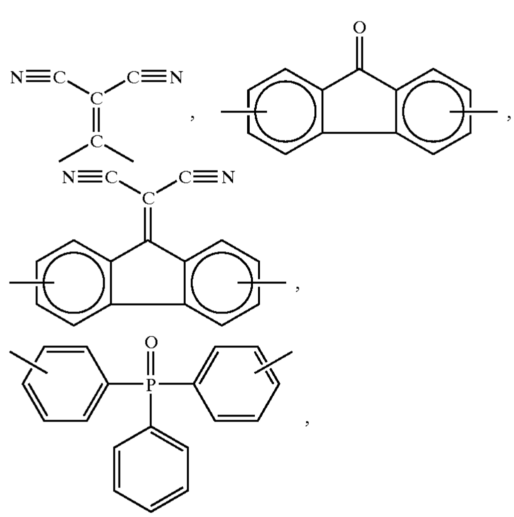
or mixtures thereof, B is
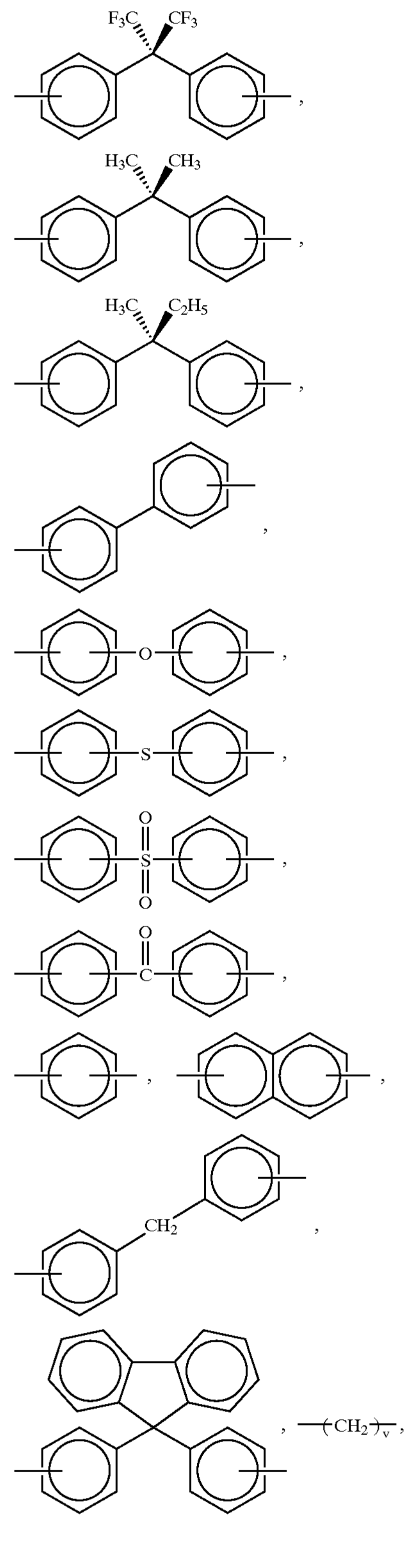
wherein v is an integer of from 1 to about 20,
—(CH$_2$O)$_t$—
wherein t is an integer of from 1 to about 20,

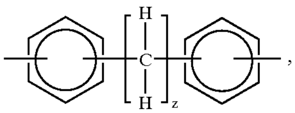
wherein z is an integer of from 2 to about 20,
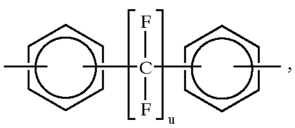
wherein u is an integer of from 1 to about 20,
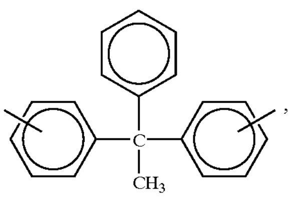
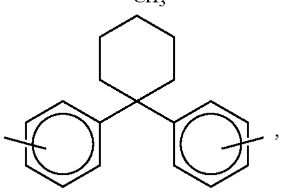
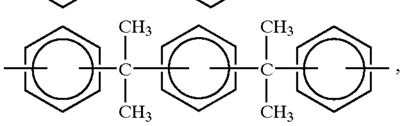
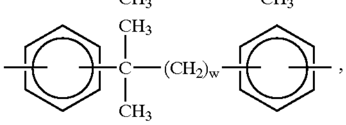
wherein w is an integer of from 1 to about 20,
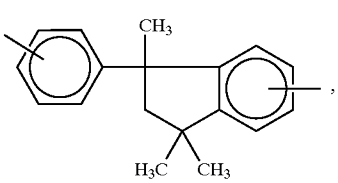
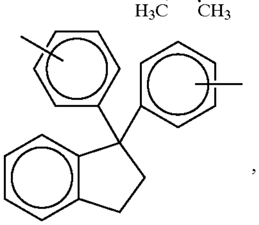
-continued
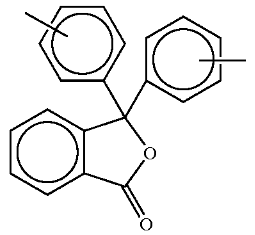
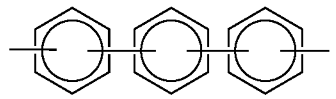
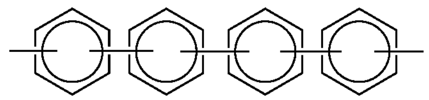
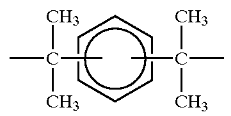
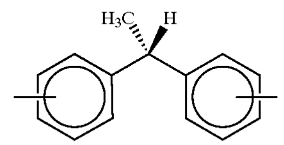
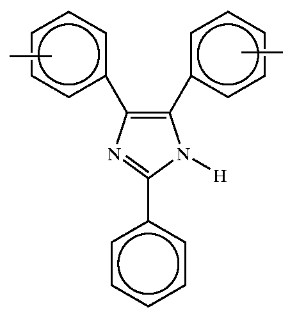
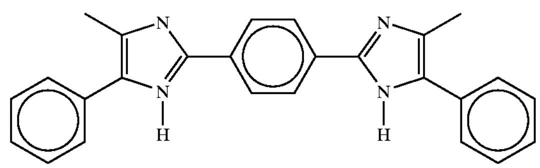
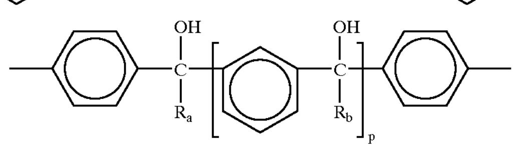
wherein $R_a$ and $R_b$ each, independently of the other, are hydrogen atoms, alkyl groups, aryl groups, arylalkyl groups, alkylaryl groups, or mixtures thereof, and p is an integer of 0 or 1,
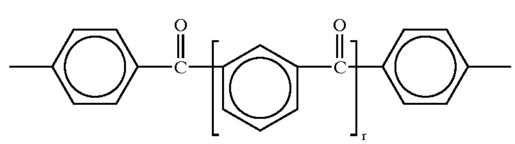
wherein r is an integer of 0 or 1,

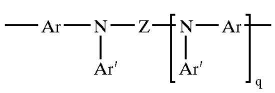

wherein (1) Z is

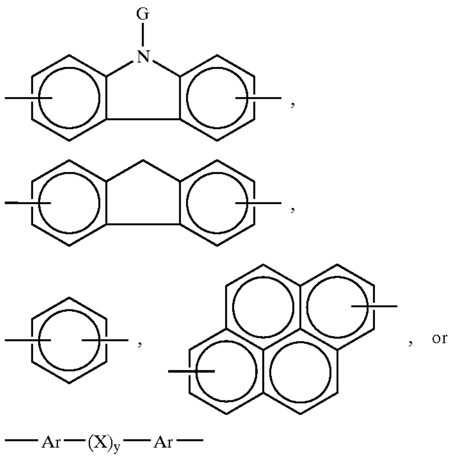

wherein y is 0 or 1; (2) Ar is

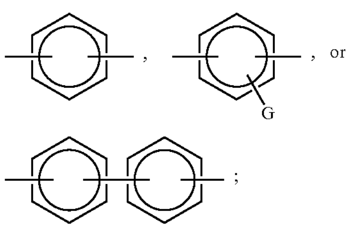

(3) G is an alkyl group selected from alkyl or isoalkyl groups containing from about 2 to about 10 carbon atoms; (4) Ar' is

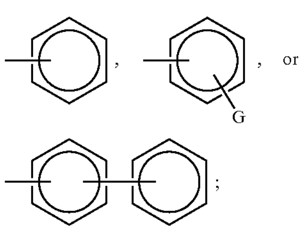

(5) X is

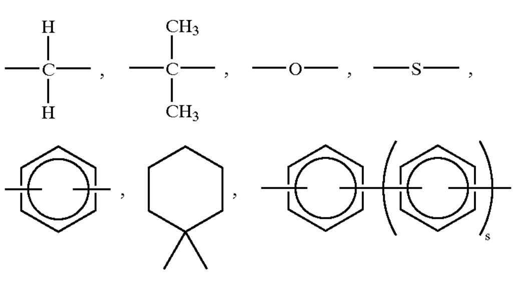

wherein s is 0, 1, or 2,

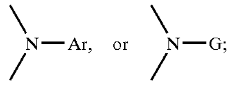

and (6) q is 0 or 1; or mixtures thereof, wherein RX represents the total number of haloalkyl groups in the polymer and is the sum of all $R_1X_1$groups+all $R_2X_2$ groups+all $R_3X_3$ groups+all $R_4X_4$ groups, and wherein the ratio of unsaturated ester groups to saturated ester groups to RX groups in the polymer is represented by $$\upsilon\epsilon:\sigma\epsilon:\rho\chi$$

wherein $\upsilon\epsilon$ is from about 1 to about 99.99, wherein $\sigma\epsilon$ is from about 0.01 to about 99, wherein $\rho\chi$ is from 0 to about 50, and wherein $\upsilon\epsilon+\sigma\epsilon+\rho\chi=100$. Another embodiment is directed to a process for preparing a photosensitive polymer which comprises reacting a haloalkylated precursor polymer of the formula

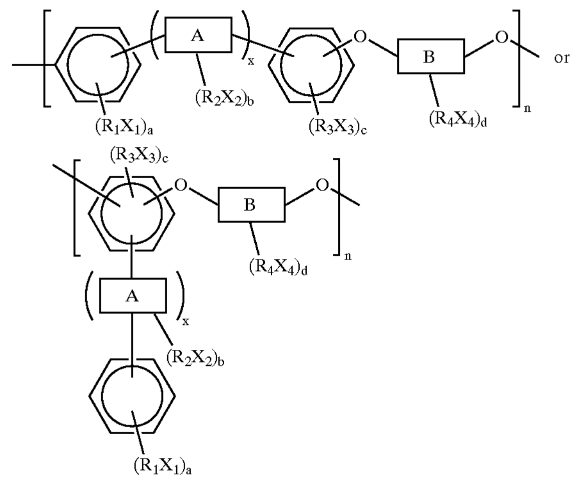

wherein x is an integer of 0 or 1, n is an integer representing the number of repeating monomer units, each of $R_1$, $R_2$, $R_3$, and $R_4$, independently of the others, is an alkyl group, an aryl group, an arylalkyl group, or an alkylaryl group, each of $X_1$, $X_2$, $X_3$, and $X_4$, independently of the others, is a halogen atom, a, b, c, and d are each integers of 0, 1, 2, 3, or 4, provided that at least one of a, b, c, and d is equal to or greater than 1 in at least some of the monomer repeat units of the polymer, A is

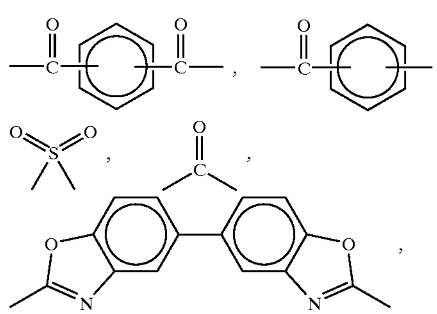

-continued
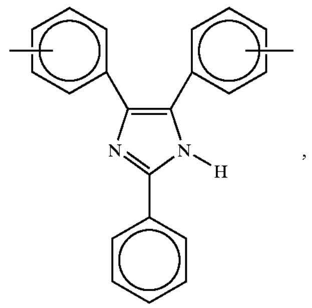
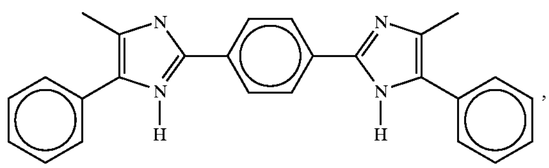
—O—, —C(CH$_3$)$_2$—, 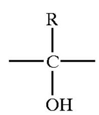
wherein R is a hydrogen atom, an alkyl group, an aryl group, an arylalkyl group, an alkylaryl group, or mixtures thereof,
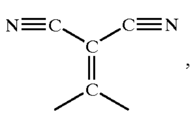
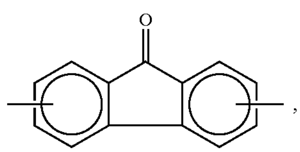
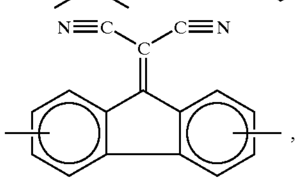
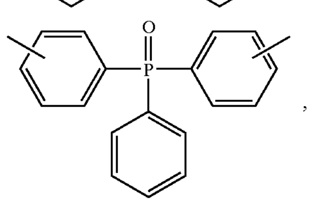
or mixtures thereof, B is
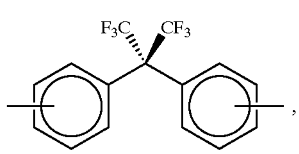
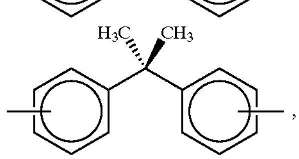
-continued
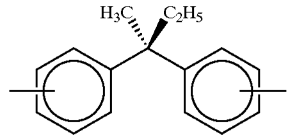
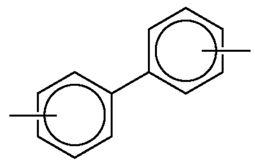
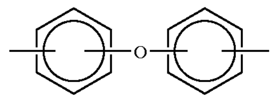
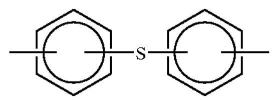
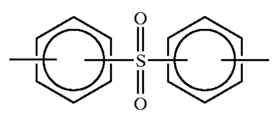
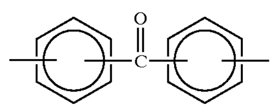
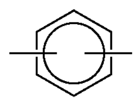
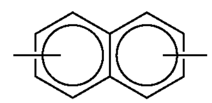
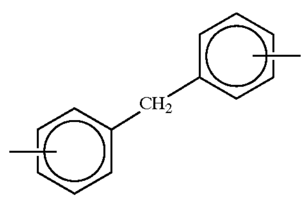
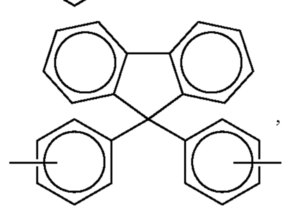
, $-(CH_2)_v-$,
wherein v is an integer of from 1 to about 20,
$-(CH_2O)_t-$
wherein t is an integer of from 1 to about 20,
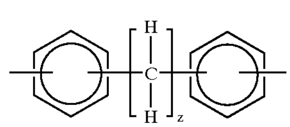
wherein z is an integer of from 2 to about 20,

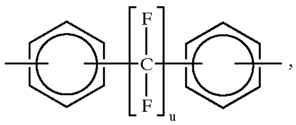
wherein u is an integer of from 1 to about 20,
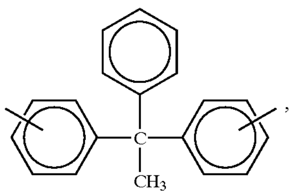
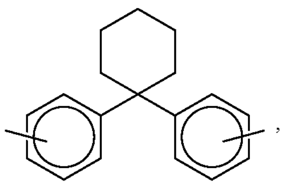
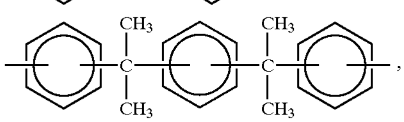
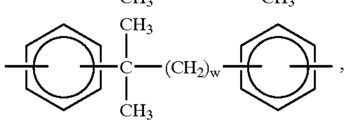
wherein w is an integer of from 1 to about 20,
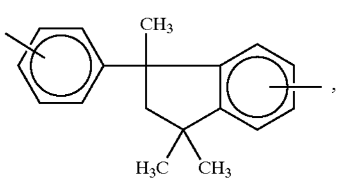
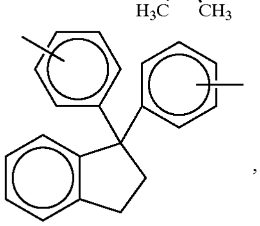
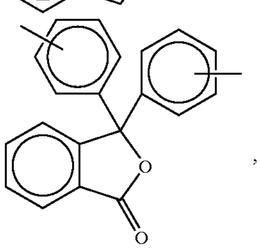
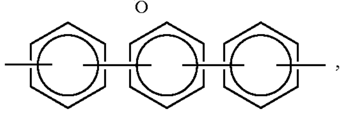
-continued
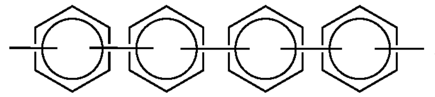
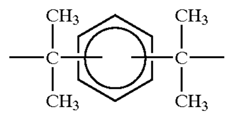
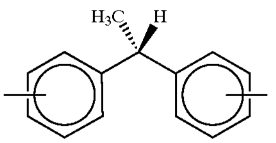
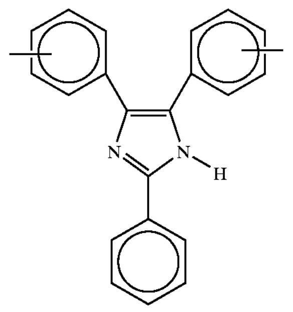
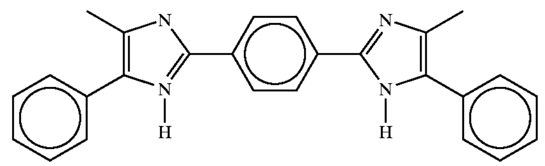
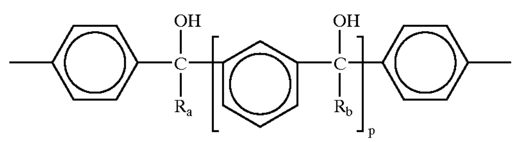
wherein $R_a$ and $R_b$ each, independently of the other, are hydrogen atoms, alkyl groups, aryl groups, arylalkyl groups, alkylaryl groups, or mixtures thereof, and p is an integer of 0 or 1,
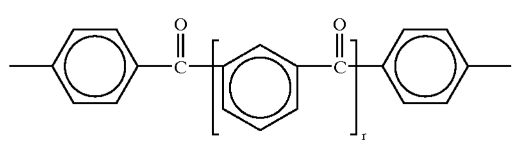
wherein r is an integer of 0 or 1,
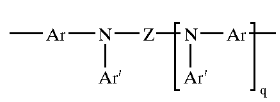
wherein (1) Z is
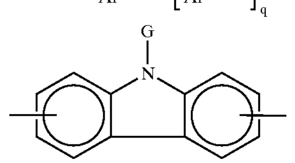
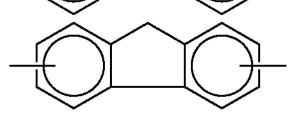

-continued

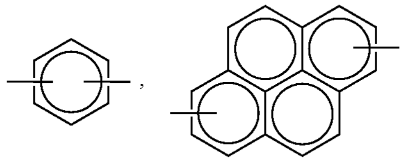

, or $—Ar—(X)_y—Ar—$ wherein y is O or 1; (2) Ar is

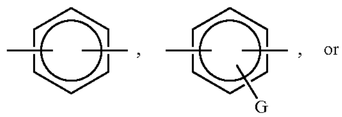

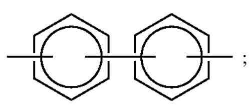

(3) G is an alkyl group selected from alkyl or isoalkyl groups containing from about 2 to about 10 carbon atoms; (4) Ar' is

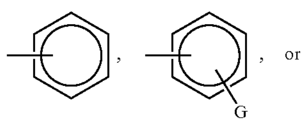

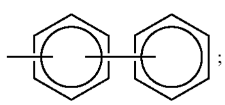

(5) X is

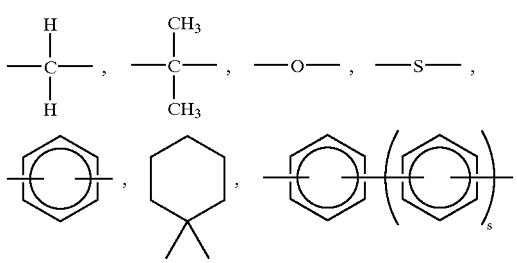

wherein s is 0, 1, or 2,

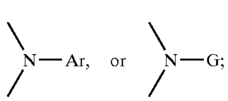

and (6) q is 0 or 1; or mixtures thereof, with an unsaturated ester salt and a saturated ester salt, thereby forming a curable polymer of the formula

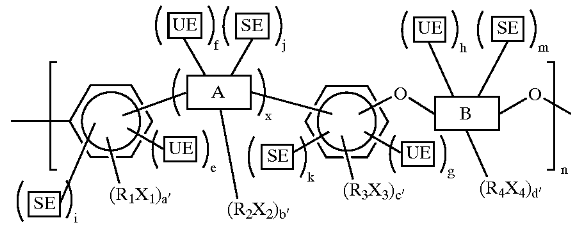

or

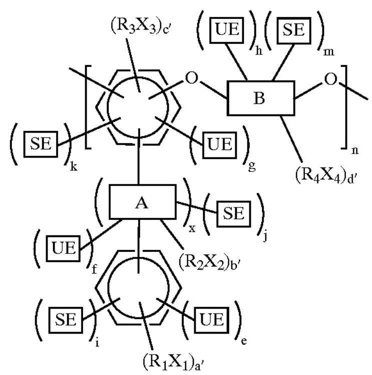

wherein a', b', c', and d' are each, independently of the others, integers of 0, 1, 2, 3, or 4, each UE group, independently of the others, is an unsaturated ester group corresponding to the unsaturated ester salt, e, f, g, and h are each, independently of the others, integers of 0, 1, 2, 3, or 4, provided that at least one of e, f, g, and h is equal to or greater than 1 in at least some of the monomer repeat units of the polymer, each SE group, independently of the others, is a saturated ester group corresponding to the saturated ester salt, and i, j, k, and m are each, independently of the others, integers of 0, 1, 2, 3, or 4, provided that at least one of i, j, k, and m is equal to or greater than 1 in at least some of the monomer repeat units of the polymer, provided that the sum of a'+e+i is less than or equal to 4, provided that the sum of b'+f+j is less than or equal to 4, provided that the sum of c'+g+k is less than or equal to 4, and provided that the sum of d'+h+m is less than or equal to 4, wherein RX represents the total number of haloalkyl groups in the polymer and is the sum of all $R_1X_1$ groups+all $R_2X_2$ groups+all $R_3X_3$ groups+all $R_4X_4$ groups, wherein the ratio of unsaturated ester salt to saturated ester salt is selected so that in the resulting polymer the ratio of unsaturated ester groups to saturated ester groups to RX groups in the polymer is represented by $$\upsilon\epsilon : \sigma\epsilon : \rho\chi$$

wherein $\upsilon\epsilon$ is from about 1 to about 99.99, wherein $\sigma\epsilon$ is from about 0.01 to about 99, wherein $\rho\chi$ is from 0 to about 50, and wherein $\upsilon\epsilon+\sigma\epsilon+\rho\chi=100$.

BRIEF DESCRIPTION OF THE DRAWING

The FIGURE illustrates the progress of the reaction carried out in Example III.

DETAILED DESCRIPTION

Disclosed herein is a polymer of the formula

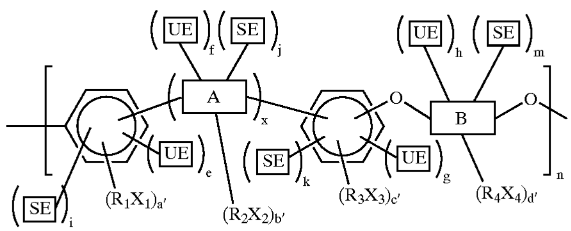

or

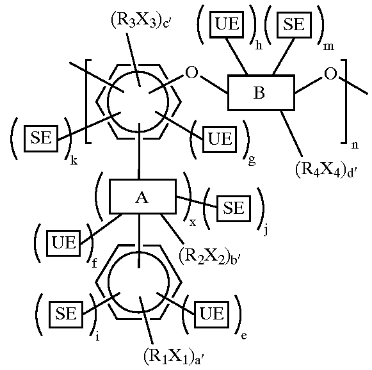

wherein x is an integer of 0 or 1, n is an integer representing the number of repeating monomer units, $R_1$, $R_2$, $R_3$, and $R_4$ each, independently of the others, is an alkyl group (including saturated, unsaturated, linear, branched, cyclic, unsubstituted, and substituted alkyl groups, and wherein hetero atoms, such as oxygen, nitrogen, sulfur, silicon, phosphorus, and the like either may or may not be present in the alkyl group), in one embodiment with at least 1 carbon atom, and in another embodiment with at least about 2 carbon atoms, and in one embodiment with no more than about 11 carbon atoms, in another embodiment with no more than about 5 carbon atoms, in yet another embodiment with no more than about 3 carbon atoms, and in still another embodiment with no more than about 2 carbon atoms, although the number of carbon atoms can be outside of these ranges, an aryl group (including unsubstituted and substituted aryl groups, and wherein hetero atoms, such as oxygen, nitrogen, sulfur, silicon, phosphorus, and the like either may or may not be present in the aryl group), in one embodiment with at least about 6 carbon atoms, and in one embodiment with no more than about 28 carbon atoms, in another embodiment with no more than about 16 carbon atoms, in yet another embodiment with no more than about 13 carbon atoms, and in still another embodiment with no more than about 10 carbon atoms, such as phenyl or the like, an arylalkyl group (including unsubstituted and substituted arylalkyl groups, and wherein hetero atoms, such as oxygen, nitrogen, sulfur, silicon, phosphorus, and the like either may or may not be present in either or both of the alkyl portion and the aryl portion of the arylalkyl group), in one embodiment with at least about 7 carbon atoms, and in one embodiment with no more than about 29 carbon atoms, in another embodiment with no more than about 17 carbon atoms, in yet another embodiment with no more than about 13 carbon atoms, and in still another embodiment with no more than about 9 carbon atoms, such as benzyl or the like, or an alkylaryl group (including unsubstituted and substituted alkylaryl groups, and wherein hetero atoms, such as oxygen, nitrogen, sulfur, silicon, phosphorus, and the like either may or may not be present in either or both of the alkyl portion and the aryl portion of the alkylaryl group), in one embodiment with at least about 7 carbon atoms, and in one embodiment with no more than about 29 carbon atoms, in another embodiment with no more than about 17 carbon atoms, in yet another embodiment with no more than about 13 carbon atoms, and in still another embodiment with no more than about 9 carbon atoms, such as tolyl or the like, $X_1$, $X_2$, $X_3$, and $X_4$, each, independently of the others, is a halogen atom, such as fluorine, chlorine, bromine, or iodine, a', b', c', and d' are each, independently of the others, integers of 0, 1, 2, 3, or 4, each UE group, independently of the others, is an unsaturated ester group, e, f, g, and h are each, independently of the others, integers of 0, 1, 2, 3, or 4, provided that at least one of e, f, g, and h is equal to or greater than 1 in at least some of the monomer repeat units of the polymer, each SE group, independently of the others, is a saturated ester group, and i, j, k, and m are each, independently of the others, integers of 0, 1, 2, 3, or 4, provided that at least one of i, j, k, and m is equal to or greater than 1 in at least some of the monomer repeat units of the polymer, provided that the sum of a'+e+i is less than or equal to 4, provided that the sum of b'+f+j is less than or equal to 4, provided that the sum of c'+g+k is less than or equal to 4, and provided that the sum of d'+h+m is less than or equal to 4, A is

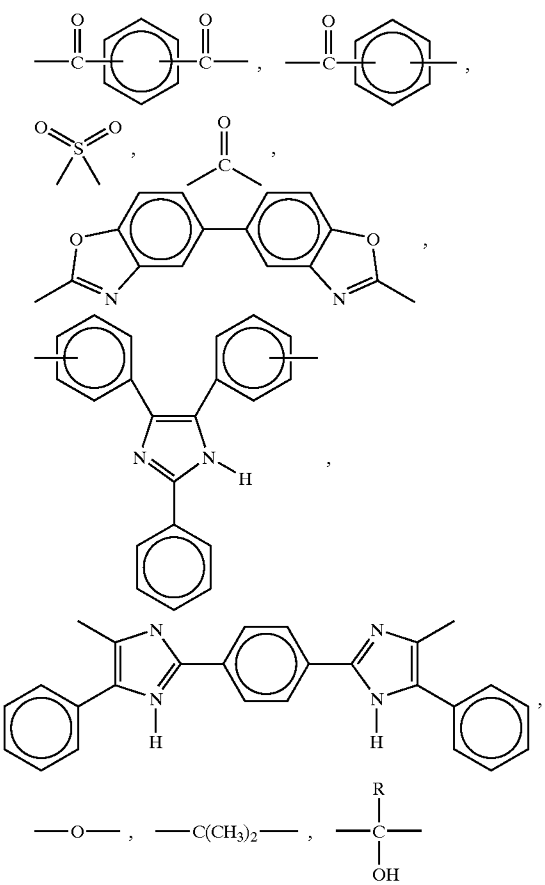

wherein R is a hydrogen atom, an alkyl group (including saturated, unsaturated, linear, branched, cyclic, unsubstituted, and substituted alkyl groups, and wherein hetero atoms, such as oxygen, nitrogen, sulfur, silicon, phosphorus, and the like either may or may not be present in the alkyl group), in one embodiment with at least 1 carbon atom, and in one embodiment with no more than about 20 carbon atoms, in another embodiment with no more than about 10 carbon atoms, and in another embodiment with no more than about 5 carbon atoms, although the number of carbon atoms can be outside of this range, an aryl group (including unsubstituted and substituted aryl groups, and wherein hetero atoms, such as oxygen, sulfur, nitrogen, silicon, phosphorus, or the like, either may or may not be present in the aryl group), in one embodiment with at least about 6 carbon atoms, and in one embodiment with no more than about 18 carbon atoms, in another embodiment with no more than about 12 carbon atoms, and in yet another embodiment with no more than about 6 carbon atoms, although the number of carbon atoms can be outside of this range, an arylalkyl group (including unsubstituted and substituted arylalkyl groups, and wherein hetero atoms, such as oxygen, nitrogen, sulfur, silicon, phosphorus, and the like either may or may not be present in either or both of the alkyl portion and the aryl portion of the arylalkyl group), in one embodiment with at least about 7 carbon atoms, and in one embodiment with no more than about 20 carbon atoms, in another embodiment with no more than about 9 carbon atoms, and in yet another embodiment with no more than about 7 carbon atoms, although the number of carbon atoms can be outside of this range, such as benzyl or the like, or an alkylaryl group (including unsubstituted and substituted alkylaryl groups, and wherein hetero atoms, such as oxygen, nitrogen, sulfur, silicon, phosphorus, and the like either may or may not be present in either or both of the alkyl portion and the aryl portion of the alkylaryl group), in one embodiment with at least about 7 carbon atoms, and in one embodiment with no more than about 20 carbon atoms, in another embodiment with no more than about 9 carbon atoms, and in yet another embodiment with no more than about 7 carbon atoms, although the number of carbon atoms can be outside of this range, such as tolyl or the like, or mixtures thereof,

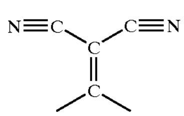

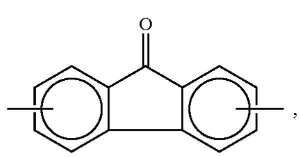

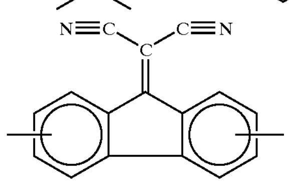

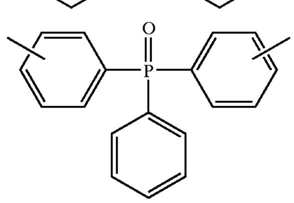

or mixtures thereof, B is

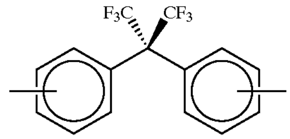

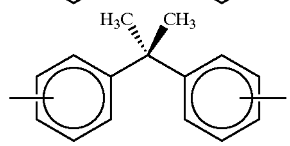

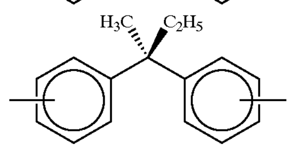

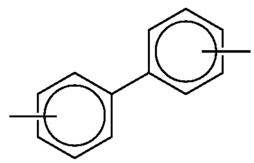

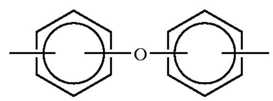

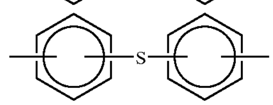

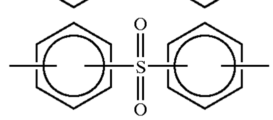

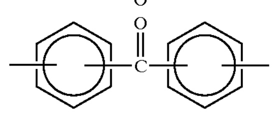

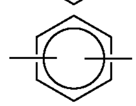

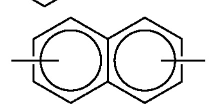

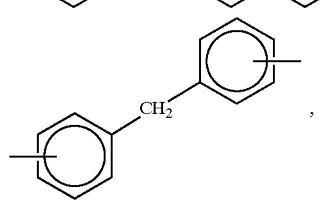

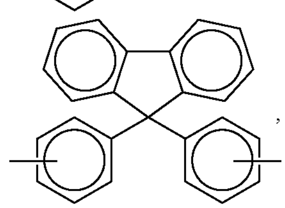

$-\!(CH_2)_v\!-$, wherein v is an integer of from 1 to about 20, and preferably from 1 to about 10, $$-(CH_2O)_t-$$

wherein t is an integer of from 1 to about 20, and preferably from 1 to about 10,

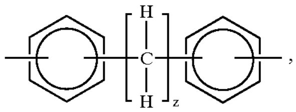

wherein z is an integer of from 2 to about 20, and preferably from 2 to about 10,

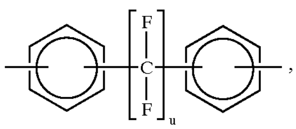

wherein u is an integer of from 1 to about 20, and preferably from 1 to about 10,

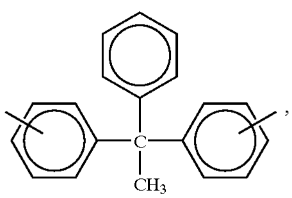

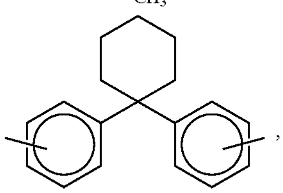

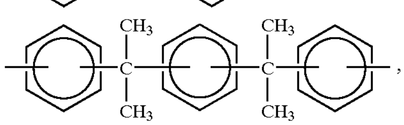

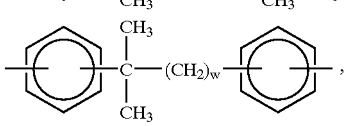

wherein w is an integer of from 1 to about 20, and preferably from 1 to about 10,

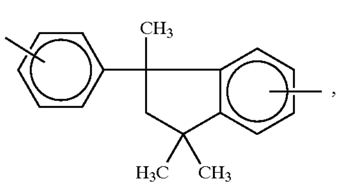

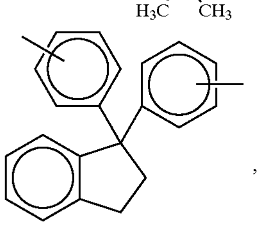

-continued

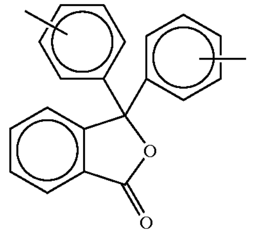

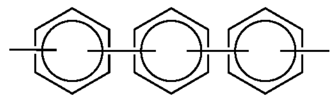

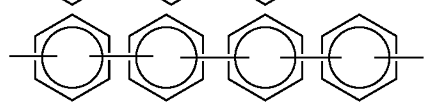

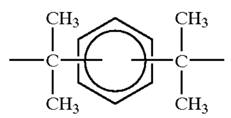

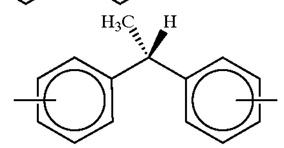

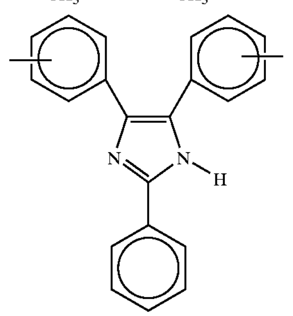

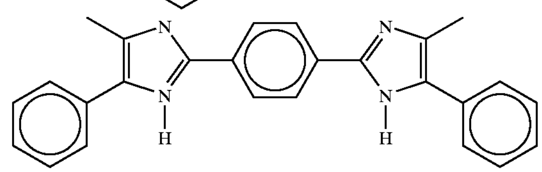

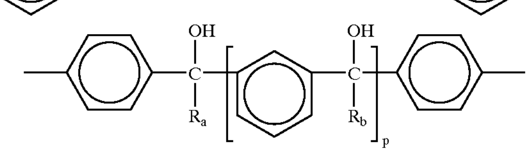

wherein $R_a$ and $R_b$ each, independently of the other, are hydrogen atoms, alkyl groups (including saturated, unsaturated, linear, branched, cyclic, unsubstituted, and substituted alkyl groups, and wherein hetero atoms, such as oxygen, nitrogen, sulfur, silicon, phosphorus, and the like either may or may not be present in the alkyl group), in one embodiment with at least 1 carbon atom, and in one embodiment with no more than about 20 carbon atoms, in another embodiment with no more than about 10 carbon atoms, and in yet another embodiment with no more than about 5 carbon atoms, although the number of carbon atoms can be outside of this range, aryl groups (including unsubstituted and substituted aryl groups, and wherein hetero atoms, such as oxygen, sulfur, nitrogen, silicon, phosphorus, or the like, either may or may not be present in the aryl group), in one embodiment with at least about 6 carbon atoms, and in one embodiment with no more than about 18 carbon atoms, in another embodiment with no more than about 12 carbon atoms, and in yet another embodiment with no more than about 6 carbon atoms, although the number of carbon atoms can be outside of this range, arylalkyl groups (including unsubstituted and substituted arylalkyl groups, and wherein hetero atoms, such as oxygen, nitrogen, sulfur, silicon, phosphorus, and the like either may or may not be present in either or both of the alkyl portion and the aryl portion of the arylalkyl group), in one embodiment with at least about 7 carbon atoms, and in one embodiment with no more than about 20 carbon atoms, in another embodiment with no more than about 9 carbon atoms, and in yet another embodiment with no more than about 7 carbon atoms, although the number of carbon atoms can be outside of this range, such as benzyl or the like, or alkylaryl groups (including unsubstituted and substituted alkylaryl groups, and wherein hetero atoms, such as oxygen, nitrogen, sulfur, silicon, phosphorus, and the like either may or may not be present in either or both of the alkyl portion and the aryl portion of the alkylaryl group), in one embodiment with at least about 7 carbon atoms, and in one embodiment with no more than about 20 carbon atoms, in another embodiment with no more than about 9 carbon atoms, and in yet another embodiment with no more than about 7 carbon atoms, although the number of carbon atoms can be outside of this range, such as tolyl or the like, or mixtures thereof, and p is an integer of 0 or 1,

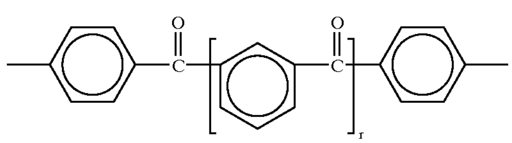

wherein r is an integer of 0 or 1,

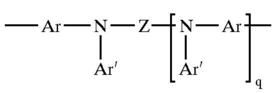

wherein (1) Z is

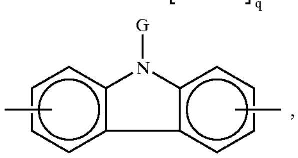

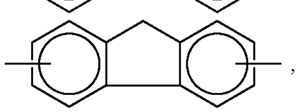

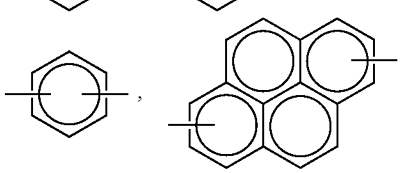

, or

—Ar—$(X)_y$—Ar— wherein y is 0 or 1: (2) Ar is

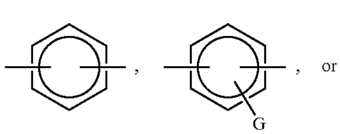

-continued

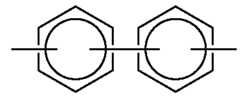

(3) G is an alkyl group selected from alkyl or isoalkyl groups containing from about 2 to about 10 carbon atoms; (4) Ar' is

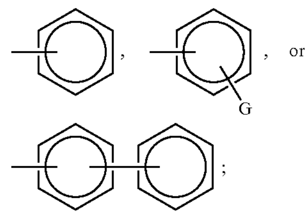

(5) X is

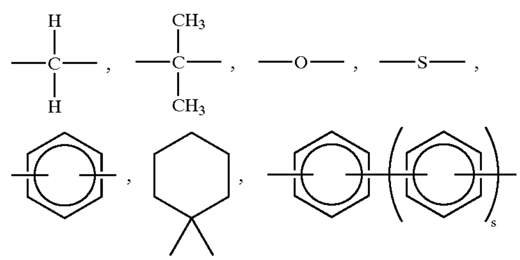

wherein s is 0, 1, or 2,

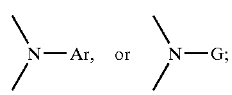

and (6) q is 0 or 1; or mixtures thereof, and wherein the substituents on the substituted alkyl groups, substituted aryl groups, substituted arylalkyl groups, and substituted alkylaryl groups can be (but are not limited to) hydroxy groups, halogen atoms, amine groups, pyridine groups, pyridinium groups, phosphine groups, cyano groups, ether groups, aldehyde groups, ketone groups, carboxylic acid groups, ester groups, amide groups, carbonyl groups, thiocarbonyl groups, sulfonate groups, sulfide groups, sulfoxide groups, phosphate groups, nitrile groups, mercapto groups, nitro groups, nitroso groups, sulfone groups, acyl groups, azo groups, azide groups, cyanato groups, isocyanato groups, thiocyanato groups, isothiocyanato groups, mixtures thereof, and the like, wherein two or more substituents can be joined together to form a ring.

In one embodiment, the unsaturated ester groups are of the formula

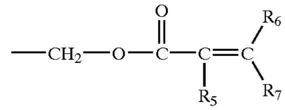

wherein $R_5$, $R_6$, and $R_7$ each, independently of the others, is a hydrogen atom, an alkyl group (including saturated, unsaturated, linear, branched, cyclic, unsubstituted, and substituted alkyl groups, and wherein hetero atoms, such as oxygen, nitrogen, sulfur, silicon, phosphorus, and the like either may or may not be present in the alkyl group), in one embodiment with at least 1 carbon atom, and in one embodiment with no more than about 20 carbon atoms, in another embodiment with no more than about 10 carbon atoms, and in yet another embodiment with no more than about 5 carbon atoms, although the number of carbon atoms can be outside of this range, aryl groups (including unsubstituted and substituted aryl groups, and wherein hetero atoms, such as oxygen, sulfur, nitrogen, silicon, phosphorus, or the like, either may or may not be present in the aryl group), in one embodiment with at least about 6 carbon atoms, and in one embodiment with no more than about 18 carbon atoms, in another embodiment with no more than about 12 carbon atoms, and in yet another embodiment with no more than about 6 carbon atoms, although the number of carbon atoms can be outside of this range, arylalkyl groups (including unsubstituted and substituted arylalkyl groups, and wherein hetero atoms, such as oxygen, nitrogen, sulfur, silicon, phosphorus, and the like either may or may not be present in either or both of the alkyl portion and the aryl portion of the arylalkyl group), in one embodiment with at least about 7 carbon atoms, and in one embodiment with no more than about 20 carbon atoms, in another embodiment with no more than about 9 carbon atoms, and in yet another embodiment with no more than about 7 carbon atoms, although the number of carbon atoms can be outside of these ranges, such as benzyl or the like, alkylaryl groups (including unsubstituted and substituted alkylaryl groups, and wherein hetero atoms, such as oxygen, nitrogen, sulfur, silicon, phosphorus, and the like either may or may not be present in either or both of the alkyl portion and the aryl portion of the alkylaryl group), in one embodiment with at least about 7 carbon atoms, and in one embodiment with no more than about 20 carbon atoms, in another embodiment with no more than about 9 carbon atoms, and in yet another embodiment with no more than about 7 carbon atoms, although the number of carbon atoms can be outside of this range, such as tolyl or the like, or mixtures thereof, and wherein the substituents on the substituted alkyl groups, substituted aryl groups, substituted arylalkyl groups, and substituted alkylaryl groups can be (but are not limited to) hydroxy groups, halogen atoms, amine groups, pyridine groups, pyridinium groups, phosphine groups, cyano groups, ether groups, aldehyde groups, ketone groups, carboxylic acid groups, ester groups, amide groups, carbonyl groups, thiocarbonyl groups, sulfonate groups, sulfide groups, sulfoxide groups, phosphate groups, nitrile groups, mercapto groups, nitro groups, nitroso groups, sulfone groups, acyl groups, azo groups, azide groups, cyanato groups, isocyanato groups, thiocyanato groups, isothiocyanato groups, mixtures thereof, and the like, wherein two or more substituents can be joined together to form a ring. Specific examples of suitable unsaturated ester groups include (but are not limited to) esters of acrylic acid, methacrylic acid, cinnamic acid, crotonic acid, ethacrylic acid, oleic acid, linoleic acid, maleic acid, fumaric acid, itaconic acid, citraconic acid, phenylmaleic acid, 3-hexene-1,6-dicarboxylic acid, and the like, as well as mixtures thereof.

For purposes of the present discussion, the term "saturated ester groups" includes those containing aryl or aromatic portions as well as those containing saturated aliphatic portions; "unsaturated" in the present polymers indicates that the group does not contain unsaturated aliphatic or alkyl portions. In one embodiment, the saturated ester groups are of the formula

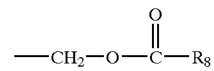

wherein $R_8$ is a hydrogen atom, a saturated alkyl group (including linear, branched, cyclic, unsubstituted, and substituted alkyl groups, and wherein hetero atoms, such as oxygen, nitrogen, sulfur, silicon, phosphorus, and the like either may or may not be present in the alkyl group), in one embodiment with at least 1 carbon atom, and in one embodiment with no more than about 30 carbon atoms, and in another embodiment with no more than about 6 carbon atoms, although the number of carbon atoms can be outside of this range, aryl groups (including unsubstituted and substituted aryl groups, and wherein hetero atoms, such as oxygen, sulfur, nitrogen, silicon, phosphorus, or the like, either may or may not be present in the aryl group), in one embodiment with at least about 6 carbon atoms, and in one embodiment with no more than about 30 carbon atoms, in another embodiment with no more than about 12 carbon atoms, and in yet another embodiment with no more than about 6 carbon atoms, although the number of carbon atoms can be outside of this range, arylalkyl groups (including unsubstituted and substituted arylalkyl groups, and wherein hetero atoms, such as oxygen, nitrogen, sulfur, silicon, phosphorus, and the like either may or may not be present in either or both of the alkyl portion and the aryl portion of the arylalkyl group, wherein the alkyl portion of the arylalkyl group is saturated), in one embodiment with at least about 7 carbon atoms, and in one embodiment with no more than about 35 carbon atoms, and in another embodiment with no more than about 15 carbon atoms, although the number of carbon atoms can be outside of this range, such as benzyl or the like, alkylaryl groups (including unsubstituted and substituted alkylaryl groups, and wherein hetero atoms, such as oxygen, nitrogen, sulfur, silicon, phosphorus, and the like either may or may not be present in either or both of the alkyl portion and the aryl portion of the alkylaryl group, wherein the alkyl portion of the alkylaryl group is saturated), in one embodiment with at least about 7 carbon atoms, and in one embodiment with no more than about 35 carbon atoms, and in another embodiment with no more than about 15 carbon atoms, although the number of carbon atoms can be outside of this range, such as tolyl or the like, or mixtures thereof, and wherein the substituents on the substituted alkyl groups, substituted aryl groups, substituted arylalkyl groups, and substituted alkylaryl groups can be (but are not limited to) hydroxy groups, halogen atoms, amine groups, pyridine groups, pyridinium groups, phosphine groups, cyano groups, ether groups, aldehyde groups, ketone groups, carboxylic acid groups, ester groups, amide groups, carbonyl groups, thiocarbonyl groups, sulfonate groups, sulfide groups, sulfoxide groups, phosphate groups, nitrile groups, mercapto groups, nitro groups, nitroso groups, sulfone groups, acyl groups, azo groups, azide groups, cyanato groups, isocyanato groups, thiocyanato groups, isothiocyanato groups, mixtures thereof, and the like, wherein two or more substituents can be joined together to form a ring. Specific examples of suitable saturated ester groups include (but are not limited to) esters of acetic acid, propionic acid, butanoic acid, higher branched and linear alkyl carboxy acids, cyclohexanoic acid, other higher and lower cycloalkylcarboxylic acids, polyhydrogenated naphthalene carboxylic acid, other polycyclic saturated carboxylic acids, and the like as well as mixtures thereof.

The haloalkylated precursor polymer can be prepared by any desired or effective method, such as those disclosed in, for example, U.S. Pat. No. 5,739,254, U.S. Pat. No. 5,753,783, U.S. Pat. No. 6,187,512, U.S. Pat. No. 6,020,119, and Copending application U.S. Ser. No. 10/040,850, the disclosures of each of which are totally incorporated herein by reference.

The degree of substitution (i.e., the average number of haloalkyl groups per monomer repeat unit repeat unit) can be as high or low as desired for the intended use of the polymer, in one embodiment at least about 0.5, and in another embodiment at least about 0.7, and in one embodiment no more than about 1.2, and in another embodiment no more than about 0.8, although the degree of substitution can be outside of these ranges.

The haloalkylated polymer can be substituted by reacting the haloalkylated polymer with a mixture containing a saturated ester salt and an unsaturated ester in solution. Examples of suitable reactants include selected salts of Groups IA, IIA, IIIB, IVB, VB, VIB, VIIB, IB, IIB, IIIA, IVA, VA, VIA, VIIA, VIII, and the like, of the periodic table with (1) the appropriate saturated ester, such as the esters or acid salts of acetic acid, propionic acid, butanoic acid, higher branched and linear alkyl carboxy acids, cyclohexanoic acid, other higher and lower cycloalkylcarboxylic acids, polyhydrogenated naphthalene carboxylic acid, other polycyclic saturated carboxylic acids, and the like, as well as mixtures thereof, and (2) the appropriate unsaturated ester, such as the ester salts of acrylic acid, methacrylic acid, cinnamic acid, crotonic acid, ethacrylic acid, oleic acid, linoleic acid, maleic acid, fumaric acid, itaconic acid, citraconic acid, phenylmaleic acid, 3-hexene-1,6-dicarboxylic acid, and the like, with specific examples including lithium, sodium, potassium, rubidium, cesium, magnesium, calcium, strontium, barium, quaternary ammonium, phosphonium, and the like salts of the saturated and unsaturated ester. Examples of solvents suitable for the reaction include polar aprotic solvents such as N,N-dimethylacetamide, dimethylsulfoxide, N-methylpyrrolidinone, dimethylformamide, and the like. In this embodiment, if desired, a molar excess of the unsaturated ester can be present ("excess" here referring to an amount exceeding that which would be needed to place on the polymer the desired number of unsaturated ester groups given an unlimited period of time, and assuming that no previous or simultaneous reaction with a saturated ester is carried out).

Alternatively, instead of carrying out the reaction in a single step with a mixture of the saturated ester and the unsaturated ester, the reaction can be carried out in two separate steps, first carrying out the reaction with one of the esters, followed by carrying out the reaction with the other ester. In this embodiment, either reaction can be carried out first. When the reaction with the saturated ester is carried out first, the subsequent reaction with the unsaturated ester can be carried out and driven to rapid completion by including an excess of the unsaturated ester reactant ("excess" here referring to an amount exceeding that which would be needed to place on the polymer the desired number of unsaturated ester groups given an unlimited period of time, and assuming that no previous reaction with a saturated ester had been carried out); since the saturated ester groups already present on the polymer do not undergo exchange with the unsaturated esters during the second reaction, the degree of substitution of the final polymer with unsaturated ester groups can thus be controlled easily by selecting the appropriate stoichiometric amount of saturated ester reactant, with no need to monitor the reaction progress with respect to time. Alternatively, the reaction can be carried out with the unsaturated ester first until the desired degree of unsaturated ester substitution is achieved, followed by carrying out the reaction with the saturated ester to eliminate any remaining haloalkyl groups.

Typically, the reactants are present in relative amounts with respect to each other by weight of about 10 parts haloalkylated polymer, about 66.5 parts solvent, about 5.7 parts unsaturated ester salt, and about 4.3 parts saturated ester salt, although the relative amounts can be outside of these ranges.

The general reaction scheme, illustrated below for the reaction wherein unsaturated ester groups of the formula

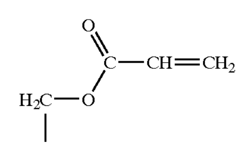

are substituted on a polymer originally substituted with chloromethyl groups and wherein acetate groups replace at least some of the remaining chloromethyl groups, is as follows:

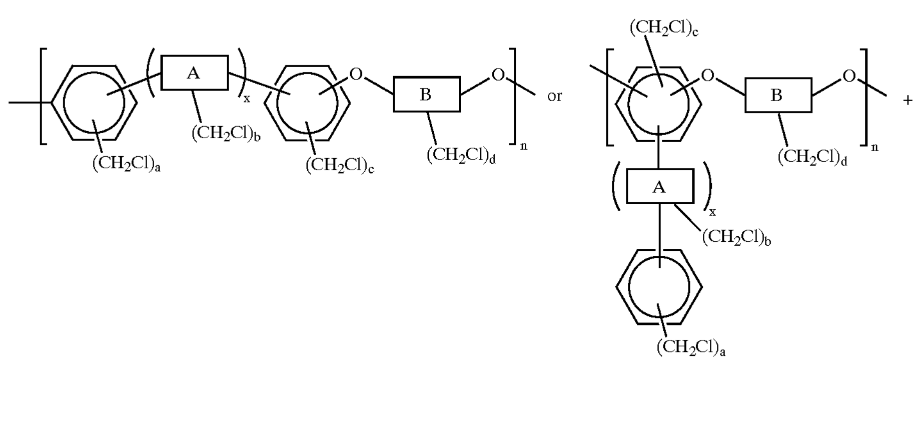

-continued
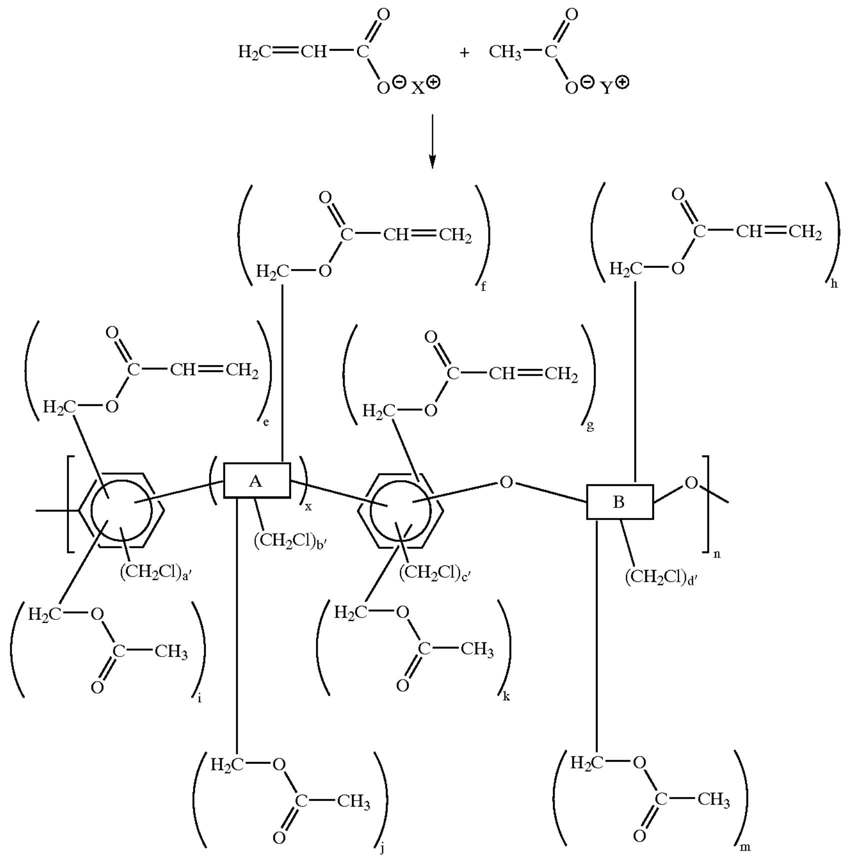
or
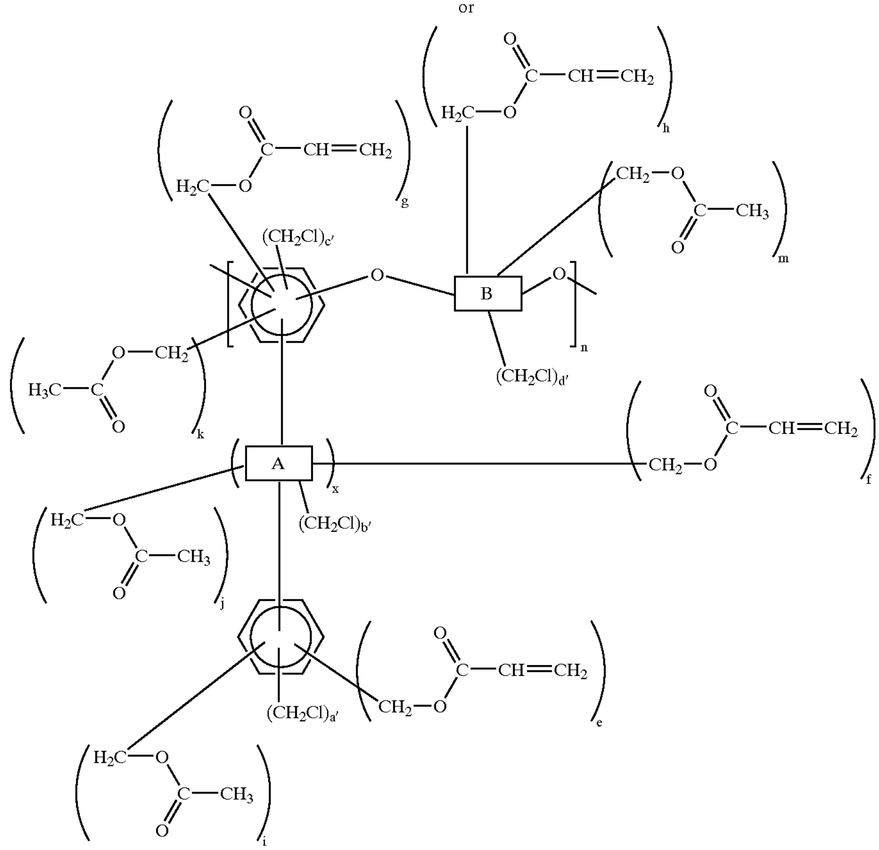

wherein X and Y each, independently of the other, is any suitable cation, such as lithium, sodium, potassium, rubidium, cesium, magnesium, calcium, strontium, barium, quaternary ammonium, phosphonium, or the like, a', b', c', d', e, f, g, h, i, j, k, and m are each integers of 0, 1, 2, 3, or 4, provided that the sum of a'+e+i is no greater than 4, the sum of b'+f+j is no greater than 4, the sum of c'+g+k is no greater than 4, and the sum of d'+h+m is no greater than 4, provided that at least one of i, j, k, and m is equal to or greater than 1 in at least some of the monomer repeat units of the polymer, and provided that at least one of e, f, g, and h is equal to at least 1 in at least some of the monomer repeat units of the polymer, and n is an integer representing the number of repeating monomer units.

Typical reaction temperatures are from about 20 to about 35° C., and preferably about 25° C., although the temperature can be outside this range. Typical reaction times are from about 30 minutes to about 15 days, and preferably from about 2 hours to about 2 days, although the time can be outside these ranges. The substitution reaction time can be reduced with the use of a catalyst, such as ADOGEN 464 (available from Aldrich Chemical Co., Milwaukee, Wis., or from Ashland Oil Co.), a long chain quaternary ammonium chloride salt, or the like. ADOGEN 464 is used at approximately 0.4 weight percent with respect to resin solids, and this catalyst results in a doubling of the reaction rate. ADOGEN 464 is sometimes difficult to remove from the product even after several water and methanol washes. Consequently, this catalyst sometimes results in cloudy photoresist solutions. The reaction can be accelerated slightly by the addition of 0.4 weight percent water, and can be inhibited by the addition of the same amount of methanol.

Some or all of the haloalkyl groups can be replaced with unsaturated ester and saturated ester substituents. Longer reaction times generally lead to greater degrees of substitution of haloalkyl groups with unsaturated ester and saturated ester substituents. The ratio of unsaturated ester salt to saturated ester salt is also used to control the relative amounts of unsaturated ester substituents, saturated ester substituents, and haloalkyl substituents.

The relative amounts of unsaturated ester groups, saturated ester groups, and haloalkyl groups on the polymer is specifically selected. The number of haloalkyl groups on the polymer can be represented by RX, wherein RX represents the total number of haloalkyl groups in the polymer and is the sum of all $R_1X_1$ groups+all $R_2X_2$ groups+all $R_3X_3$ groups+all $R_4X_4$ groups. During the synthesis of the ester-substituted polymer, within the mixture comprising the unsaturated ester salt and the saturated ester salt, the ratio of unsaturated ester salt to saturated ester salt is selected so that in the resulting polymer the ratio of unsaturated groups to saturated groups to RX groups in the polymer is represented by $$\upsilon\epsilon:\sigma\epsilon:\rho\chi.$$

The value of $\rho\chi$ in one embodiment can be zero, and in one embodiment is no more than about 50, in another embodiment no more than about 10, in yet another embodiment no more than about 5, in still another embodiment no more than about 2, in another embodiment no more than about 1, and in yet another embodiment no more than about 0.1, although the maximum value of $\rho\chi$ can be outside of these ranges.

The value of $\upsilon\epsilon$ in one embodiment is at least about 1, in another embodiment is at least about 1.5, and in yet another embodiment is at least about 2, although the minimum value of $\upsilon\epsilon$ can be outside of these ranges. In one embodiment, the value of $\upsilon\epsilon$ is no more than about 99.99, in another embodiment no more than about 99.9, and in yet another embodiment no more than about 99, although the maximum value of $\upsilon\epsilon$ can be outside of these ranges.

The value of $\sigma\epsilon$ in one embodiment is at least about 0.01, in another embodiment is at least about 0.1, and in yet another embodiment is at least about 1, although the minimum value of $\sigma\epsilon$ can be outside of these ranges. In one embodiment, the value of $\sigma\epsilon$ is no more than about 99, in another embodiment no more than about 98.5, and in yet another embodiment no more than about 98, although the maximum value of $\sigma\epsilon$ can be outside of these ranges.

Other procedures for placing functional groups on aromatic polymers are disclosed in, for example, W. H. Daly, S. Chotiwana, and R. Nielsen, *Polymer Preprints*, 20(1), 835 (1979); "Functional Polymers and Sequential Copolymers by Phase Transfer Catalysis, 3. Synthesis And Characterization of Aromatic Poly(ether sulfone)s and Poly(oxy-2,6-dimethyl-1,4-phenylene) Containing Pendant Vinyl Groups," V. Percec and B. C. Auman, *Makromol. Chem.*, 185, 2319 (1984); F. Wang and J. Roovers, *Journal of Polymer Science: Part A: Polymer Chemistry*, 32, 2413 (1994); "Details Concerning the Chloromethylation of Soluble High Molecular Weight Polystyrene Using Dimethoxymethane, Thionyl Chloride, And a Lewis Acid: A Full Analysis," M. E. Wright, E. G. Toplikar, and S. A. Svejda, *Macromolecules*, 24, 5879 (1991); "Functional Polymers and Sequential Copolymers by Phase Transfer Catalysts," V. Percec and P. L. Rinaldi, *Polymer Bulletin*, 10, 223 (1983); "Preparation of Polymer Resin and Inorganic Oxide Supported Peroxy-Acids and Their Use in the Oxidation of Tetrahydrothiophene," J. A. Greig, R. D. Hancock, and D. C. Sherrington, *Euopean Polymer J.*, 16, 293 (1980); "Preparation of Poly(vinylbenzyltriphenylphosphonium Perbromide) and Its Application in the Bromination of Organic Compounds," A. Akelah, M. Hassanein, and F. Abdel-Galil, *European Polymer J.*, 20 (3) 221 (1984); J. M. J. Frechet and K. K. Haque, *Macromelcules,* 8, 130 (1975); U.S. Pat. No. 3,914,194; U.S. Pat. No. 4,110,279; U.S. Pat. No. 3,367,914; "Synthesis of Intermediates for Production of Heat Resistant Polymers (Chloromethylation of Diphenyl oxide)," E. P. Tepenitsyna, M. I. Farberov, and A. P. Ivanovski, *Zhumal Prikladnoi Khimii*, Vol. 40, No. 11, 2540 (1967); U.S. Pat. No. 3,000,839; Chem. Abstr. 56, 590f (1962); U.S. Pat. No. 3,128,258; Chem. Abstr. 61, 4560a (1964); J. D. Doedens and H. P. Cordts, *Ind. Eng. Ch.*, 83, 59 (1961); British Patent 863,702; and Chem. Abstr. 55, 18667b (1961); the disclosures of each of which are totally incorporated herein by reference.

Polymers having the backbone structures disclosed herein are photosensitive when substituted with unsaturated ester groups, and are suitable for use as photoresists. The unsaturated ester group substituted polymer generally has outstanding physical properties and high chemical resistance. One method for preparing the polymers having the unsaturated ester substituents is to prepare first a haloalkylated precursor polymer, followed by converting the haloalkyl groups to unsaturated ester groups. The reaction to replace haloalkyl groups with unsaturated ester groups can, however, be undesirably slow in some instances. Accordingly, the reaction is often stopped before all of the haloalkyl groups have been converted to unsaturated ester groups. For example, such a reaction may be halted after a week, when a month would be needed to replace 100 percent of the haloalkyl groups with unsaturated ester groups. Haloalkyl groups remaining on the polymer can be thermally reactive, and can, depending on photoresist processing conditions, undergo thermal crosslinking. In some instances, this additional thermal crosslinking can be undesirable, because it can cause brittleness and fracturing during polishing of photopatterned features, and because residual halogen such as chlorine can in some instances cause corrosion in unprotected parts of microelectronic devices. By reacting the haloalkylated precursor polymer with a mixture of unsaturated ester salt and saturated ester salt, at least some of the haloalkyl groups that do not react with the unsaturated salt to become converted to unsaturated ester groups can react with the saturated ester salt and become converted to saturated ester groups, which are less likely to undergo thermal crosslinking and less likely to cause corrosion in microelectronic devices. While not being limited to any particular theory, it is believed that the saturated ester salts react with the haloalkyl groups more readily and more quickly than do the unsaturated ester salts because the presence of the double bond in the unsaturated ester salts decreases the nucleophilicity of the anion. Accordingly, again, while not being limited to any particular theory, it is believed that by reacting the precursor haloalkylated polymer with a mixture of unsaturated ester salt and saturated ester salt wherein the saturated salt is present in an amount approximately stoichiometrically equivalent to the amount of excess haloalkyl groups expected in the final polymer and the unsaturated salt is present in a stoichiometric excess relative to the amount of halomethyl groups to be converted, the final polymer can have a minimal number of haloalkyl groups without diminishing the number of photoactive unsaturated ester groups.

Specific embodiments will now be described in detail. These examples are intended to be illustrative, and the claims are not limited to the materials, conditions, or process parameters set forth in these embodiments. All parts and percentages are by weight unless otherwise indicated.

EXAMPLE I

Potassium carbonate (437.7 grams, 3.167 mol; obtained from Caledon Laboratories, Georgetown, Ontario), bisphenol-A (302.9 grams, 1.327 mol; obtained from Shell Canada Chemical Co., Calgary, Alberta), 4,4'-difluorobenzophenone (312.9 grams, 1.434 mol; obtained from Oakwood Chemicals, West Columbia, SC and Honeywell Specialty Chemicals, Morristown, N.J.), 4-t-butyl phenol (32.4 grams, 0.216 mol; obtained from Aldrich Chemical Canada, Oakville, Ontario), toluene (173.0 grams, 200.0 milliliters; obtained from Caledon Laboratories, Georgetown, Ontario), and N,N-dimethylacetamide (1,894.0 grams, 2,021.3 milliliters; obtained from Aldrich Chemical Canada, Oakville, Ontario) were added to a 3-necked 5 liter Morton flask fitted with a Claisen adapter, nitrogen bubbler, submersible thermometer, and 500 milliliter still head containing toluene (370 milliliters) topped with a water-jacketed condenser. The reaction mixture was agitated mechanically at 500 rpm using an IKA RW 20 DZM.n overhead stirrer with glass stir rod and TEFLON® blade. The reaction mixture was refluxed for 6 hours under a slow nitrogen purge while the distillate was allowed to recirculate into the reaction flask while periodically draining the produced water. After air cooling to room temperature, the reaction mixture was diluted with 1 liter of N,N-dimethylacetamide and vacuum filtered through #4 Whatman filter paper and added gradually to 30 liters of vigorously stirring methanol (obtained from Caledon Laboratories, Georgetown, Ontario). The precipitate was isolated by vacuum filtration through # 1 Whatman filter paper, followed by stirring in 5 liters of deionized water for 1 hour, refiltration, subsequent stirring in 5 liters of methanol for 1 hour, and a final filtration. The precipitate was dried in a vacuum oven (30° C., 7 mtorr) for three days to yield a white free flowing powder (558 grams, 3.00 percent volatiles, 90.0 percent yield). $^{1}H$ and $^{19}F$ NMR spectrographs indicated that the resulting polymer had no terminal fluorine groups, and the presence of a mono-t-butylphenolic endgroup in the appropriate stoichiometry was confirmed.

EXAMPLE II

Chloromethylethylether (394 grams, 387 milliliters, 4.17 mol; obtained from Aldrich Chemical Canada, Oakville, Ontario), 1,2-dichloroethane (1,220 milliliters, 1,532 grams; obtained from Caledon Laboratories, Georgetown, Ontario), acetyl chloride (53 milliliters, 5.9 grams, 0.075 mol; obtained from Aldrich Chemical Canada, Oakville, Ontario), methanol (4 milliliters, 3 grams, 0.1 mol; obtained from Caledon Laboratories, Georgetown, Ontario), and tin(IV) tetrachloride (56 milliliters, 125 grams, 0.48 mol; obtained from Aldrich Chemical Canada, Oakville, Ontario) were added to a 3-necked 5-liter round-bottom flask equipped with two Claisen adaptors, nitrogen inlet/outlet, addition funnel, thermometer, and mechanical stirrer with glass stir rod and TEFLON paddle and purged with nitrogen. A solution of the resin prepared in Example 1 (200 grams, 0.0360 mol) and 1,2-dichloroethane (1,256 grams, 1.000 liter) was added over 1.5 hours to the reaction mixture. The reaction was mechanically stirred at 400 rpm. At 20 hours, methanol (100 milliliters, 79.1 grams) was added to quench the reaction. The reaction mixture was precipitated by adding it gradually for 1 hour to vigorously stirring methanol (16 liters, 13 kilograms). The slurry was vacuum filtered through a #4 Whatman filter paper and air-dried with vacuum. Yield 253 grams of polymer (1% volatiles by thermogravimetric analysis) having 2.4 chloromethyl groups per polymer repeat unit, including chloromethyl groups on the polymer terminal t-butylphenolic groups (as indicated by $^{1}H$ NMR ($CDCl_3$)).

EXAMPLE III

Under yellow light in a 1,200 milliliter amber glass vessel under a blanket of argon, the resin prepared in Example 11 (80.00 grams, 0.146 moles repeat units, 0.410 mol chloromethylgroups), N,N-dimethylacetamide (540 grams, obtained from Aldrich Chemical Canada, Oakville, Ontario), and ADOGEN 464 (3.2 grams, obtained from Aldrich Chemical Canada, Oakville, Ontario) were magnetically stirred until all solids were dissolved. To this reaction mixture were added sodium acetate (13.45 grams, 0.164 mol, obtained from Aldrich Chemical Canada, Oakville, Ontario) and sodium acrylate (46.27 grams, 0.492 mol, 2 molar excess, obtained from Aldrich Chemical Canada, Oakville, Ontario) and the vessel was sealed under argon. The conversion as a function of time is indicated in FIG. 1. After 5 days the vessel was unsealed and the contents filtered through a #4 Whatman filter paper, and the resulting solution was precipitated gradually into methanol (4 liters, obtained from Caledon Laboratories, Georgetown, Ontario). The resulting polymer powder was isolated by vacuum filtration through a #4 Whatman filter paper, reslurried in methanol (4 liters), isolated by vacuum filtration through a #4 Whatman filter paper, air dried for 4 hours, and then vacuum dried overnight (60° C., 10 mmHg). The yield was quantitative and the resulting polymer had 38% acetate group substitution, 59% acrylate group substitution, and 3% residual chloromethyl groups (as indicated by $^{1}H$ NMR ($CDCl_3$)), wherein the percentages represent percentages of the original chloromethyl substituents. The FIGURE illustrates the progress of the reaction, wherein the left axis represents the percentage of acetate or acrylate groups present on the polymer, the right axis represents the percentage of chloromethyl groups converted to acetate or acrylate groups, the bottom axis represents time in days, and the arrows indicate whether the particular plot refers to the left axis or the right axis.

EXAMPLE IV

Under yellow light in a 1,200 milliliter amber glass vessel under a blanket of argon, the resin prepared in Example II (80.00 grams, 0.146 moles repeat units, 0.410 mol chloromethyl groups), N,N-dimethylacetamide (540 grams, obtained from Aldrich Chemical Canada, Oakville, Ontario), and ADOGEN 464 (3.2 grams, obtained from Aldrich Chemical Canada, Oakville, Ontario) were magnetically stirred until all solids were dissolved. To this reaction mixture was added sodium acetate (13.45 grams, 0.164 mol, obtained Aldrich Chemical Canada, Oakville, Ontario), the vessel was sealed under argon, and the mixture was stirred for 1 day. The vessel was then opened and sodium acrylate (46.27 grams, 0.492 mol, 2 molar excess, obtained from Aldrich Chemical Canada, Oakville, Ontario) was added. After 5 days the vessel was unsealed and the contents were filtered through a #4 Whatman filter paper, and the resulting solution was precipitated gradually into methanol (4 liters, obtained from Caledon Laboratories, Georgetown, Ontario). The resulting polymer powder was isolated by vacuum filtration through a #4 Whatman filter paper, reslurried in methanol (4 liters), isolated by vacuum filtration through a #4 Whatman filter paper, air dried for 4 hours, and then vacuum dried overnight (60° C., 10 mmHg). The yield was quantitative and the resulting polymer had 39% acetate group substitution, 59% acrylate group substitution and 2% residual chloromethyl groups (as indicated by $^1$H NMR ($CDCl_3$)), wherein the percentages represent percentages of the original chloromethyl substituents.

EXAMPLE V

The process of Example IV is repeated except that sodium butyrate (18.04 grams, 0.164 mol, available from Aldrich Chemical Canada, Oakville, Ontario) is used in place of sodium acetate. It is believed that the yield will be quantitative and that the resulting polymer will have 37% butyrate group substitution, 59% acrylate group substitution, and 4% residual chloromethyl groups (as indicated by $^1$H NMR ($CDCl_3$)).

EXAMPLE VI

The process of Example IV is repeated except that sodium benzoate (23.63 grams, 0.164 mol, available from Aldrich Chemical Canada, Oakville, Ontario) is used in place of sodium acetate. It is believed that the yield will be quantitative and that the resulting polymer will have 37% benzoate group substitution, 59% acrylate group substitution, and 4% residual chloromethyl groups (as indicated by $^1$H NMR ($CDCl_3$)).

EXAMPLE VII

The process of Example IV is repeated except that sodium trifluoroacetate (22.30 grams, 0.164 mol, available from Aldrich Chemical Canada, Oakville, Ontario) is used in place of sodium acetate. It is believed that the yield will be quantitative and that the resulting polymer will have 37% trifluoroacetate group substitution, 59% acrylate group substitution, and 4% residual chloromethyl groups (as indicated by $^1$H NMR ($CDCl_3$)).

EXAMPLE VIII

The process of Example IV is repeated except that the sodium salt of trans-cinnamic acid (83.71 grams, 0.492 mol, 2 molar excess, made by neutralization of trans-cinnamic acid with sodium methoxide in methanol) is used in place of sodium acrylate. It is believed that the yield will be quantitative and that the resulting polymer will have 39% acetate group substitution, 59% trans-cinnamate group substitution, and 2% residual chloromethyl groups (as indicated by $^1$H NMR ($CDCl_3$)).

EXAMPLE IX

The process of Example IV is repeated except that the sodium salt of trans-crotonic acid (53.18 grams, 0.492 mol, 2 molar excess, made by neutralization of trans-crotonic acid with sodium methoxide in methanol) is used in place of sodium acrylate. It is believed that the yield will be quantitative and that the resulting polymer will have 39% acetate group substitution, 59% trans-crotonate group substitution, and 2% residual chloromethyl groups (as indicated by $^1$H NMR ($CDCl_3$)).

EXAMPLE X

Potassium carbonate (437.7 grams, 3.167 mol; obtained from Caledon Laboratories, Georgetown, Ontario), bisphenol-C (339.7 grams, 1.327 mol; obtained from TCI Chemical Co., Portland, Oreg.), 4,4'-difluorobenzophenone (312.9 grams, 1.434 mol; obtained from Oakwood Chemicals, West Columbia, SC and Honeywell Specialty Chemicals, Morristown, N.J.), 4-t-butyl phenol (32.4 grams, 0.216 mol; obtained from Aldrich Chemical Canada, Oakville, Ontario), toluene (173.0 grams, 200.0 milliliters; obtained from Caledon Laboratories, Georgetown, Ontario), and N,N-dimethylacetamide (1,894.0 grams, 2,021.3 milliliters; obtained from Aldrich Chemical Canada, Oakville, Ontario) were added to a 3-necked 5 liter Morton flask fitted with a Claisen adapter, nitrogen bubbler, submersible thermometer, and 500 milliliter still head containing toluene (370 milliliters) topped with a water-jacketed condenser. The reaction mixture was agitated mechanically at 500 rpm using an IKA RW 20 DZM.n overhead stirrer with glass stir rod and TEFLON® blade. The reaction mixture was refluxed for 6 hours under a slow nitrogen purge while the distillate was allowed to recirculate into the reaction flask while periodically draining the produced water. After air cooling to room temperature, the reaction mixture was diluted with 1 liter of N,N-dimethylacetamide and vacuum filtered through # 4 Whatman filter paper and added gradually to 30 liters of vigorously stirring methanol (obtained from Caledon Laboratories, Georgetown, Ontario). The precipitate was isolated by vacuum filtration through # 1 Whatman filter paper, followed by stirring in 5 liters of deionized water for 1 hour, refiltration, subsequent stirring in 5 liters of methanol for 1 hour, and a final filtration. The precipitate was dried in a vacuum oven (30° C., 7 mtorr) for three days to yield a white free flowing powder (558 grams, >3.00 percent volatiles). $^1$H and $^{19}$F NMR spectrographs indicated that the resulting polymer had no terminal fluorine groups, and the presence of a monophenolic endgroup in the appropriate stoichiometry was confirmed.

EXAMPLE XI

The polymer prepared in Example X (10.0 grams, 23 mmol), N-bromosuccimide (9.01 grams, 50.6 mmol; 2.2 equivalent to methyl group; obtained from Aldrich Chemical Canada, Oakville, Ontario), benzoyl peroxide (55 milligrams, 0.2 mmol; obtained from Aldrich Chemical Canada, Oakville, Ontario), and N,N-dimethylacetamide (1,894.0 grams, 2,021.3 milliliters; obtained from Aldrich Chemical Canada, Oakville, Ontario) were added to a 3-necked 250 liter round bottomed flask fitted with a nitrogen inlet, a water-jacketed condenser, and a glass stopper. The reaction mixture was agitated mechanically at 500 rpm using an IKA RW 20 DZM.n overhead stirrer with glass stir rod and TEFLON® blade. The reaction mixture was refluxed for 16 hours under nitrogen blanket. After air-cooling to room temperature, the reaction mixture was added to 500 milliliters of vigorously stirred methanol. The precipitate was isolated by vacuum filtration through # 1 Whatman filter paper and redissolved in 100 milliliters of 1,2-dichloroethane. Any insoluble material was filtered by vacuum filtration through a # 1 Whatman filter paper. This solution was added to 500 milliliters of vigorously stirred methanol. The precipitate was isolated by vacuum filtration through # 1 Whatman filter paper. The precipitate was dried in a vacuum oven (30° C., 7 mtorr) for three days to yield a white free flowing powder (11 grams, >3.00 percent volatiles). $^1$H NMR spectrographs ($CDCl_3$) indicated that the resulting polymer had 17% residual methyl groups and 83% bromomethyl groups.

EXAMPLE XII

Under yellow light in a 150 milliliter amber glass vessel under a blanket of argon, the polymer prepared in Example XI (8.00 grams, 0.0165 moles repeat units, 0.0137 mol bromomethylgroups), N,N-dimethylacetamide (55 grams, available from Aldrich Chemical Canada, Oakville, Ontario), and ADOGEN 464 (0.32 grams, available from Aldrich Chemical Canada, Oakville, Ontario) are magnetically stirred until all solids are dissolved. To this mixture are added sodium acetate (0.449 grams, 0.0055 mol, available from Aldrich Chemical Canada, Oakville, Ontario) and sodium acrylate (1.546 grams, 0.0164 mol, 2 molar excess, available from Aldrich Chemical Canada, Oakville, Ontario) and the vessel is sealed under argon. After 5 days the vessel is unsealed and the contents are filtered through a #4 Whatman filter paper, and the resulting solution is precipitated gradually into methanol (400 milliliters, available from Caledon Laboratories, Georgetown, Ontario). The resulting polymer powder is isolated by vacuum filtration through a #4 Whatman filter paper, reslurried in methanol (400 milliliters), isolated by vacuum filtration through a #4 Whatman filter paper, air dried for 4 hours, and then vacuum dried overnight (60° C., 10 mmHg). It is believed that the yield will be quantitative and that the resulting polymer will have 39% acetate group substitution, 59% acrylate group substitution, and 2% residual bromomethyl groups (as indicated by $^1$H NMR ($CDCl_3$)).

Other embodiments and modifications may occur to those of ordinary skill in the art subsequent to a review of the information presented herein; these embodiments and modifications, as well as equivalents thereof, are also included within the scope of this invention.

The recited order of processing elements or sequences, or the use of numbers, letters, or other designations therefor, is not intended to limit a claimed process to any order except as specified in the claim itself.

What is claimed is:

1. A polymer of the formula

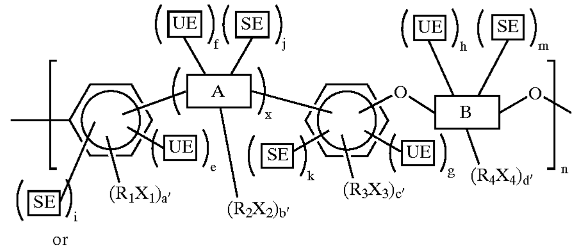

or

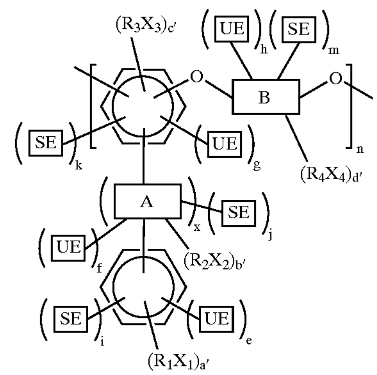

wherein x is an integer of 0 or 1, n is an integer representing the number of repeating monomer units, each of $R_1$, $R_2$, $R_3$, and $R_4$, independently of the others, is an alkyl group, an aryl group, an arylalkyl group, or an alkylaryl group, each of $X_1$, $X_2$, $X_3$, and $X_4$, independently of the others, is a halogen atom, a', b', c', and d' are each, independently of the others, integers of 0, 1, 2, 3, or 4, each UE group, independently of the others, is an unsaturated ester group, e, f, g, and h are each, independently of the others, integers of 0, 1, 2, 3, or 4, provided that at least one of e, f, g, and h is equal to or greater than 1 in at least some of the monomer repeat units of the polymer, each SE group, independently of the others, is a saturated ester group, and i, j, k, and m are each, independently of the others, integers of 0, 1, 2, 3, or 4, provided that at least one of i, j, k, and m is equal to or greater than 1 in at least some of the monomer repeat units of the polymer, provided that the sum of a'+e+i is less than or equal to 4, provided that the sum of b'+f+j is less than or equal to 4, provided that the sum of c'+g+k is less than or equal to 4, and provided that the sum of d'+h+m is less than or equal to 4, A is

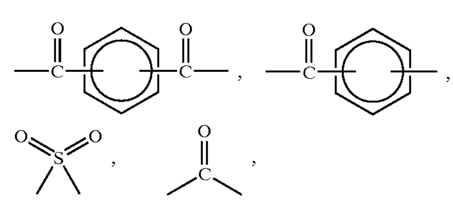

-continued
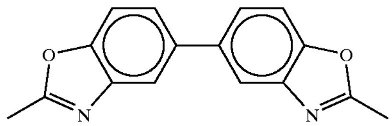
,
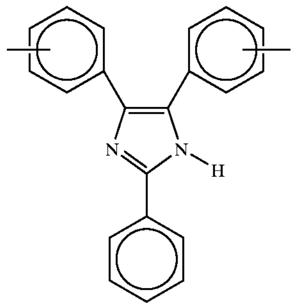
,
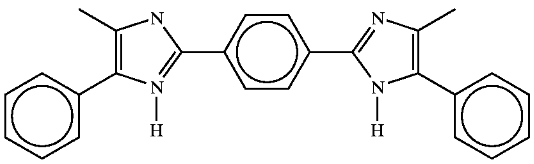
,
—O—, —C($CH_3$)$_2$—, 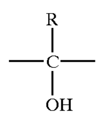
wherein R is a hydrogen atom, an alkyl group, an aryl group, an arylalkyl group, an alkylaryl group, or mixtures thereof,
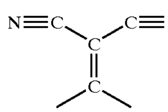
, 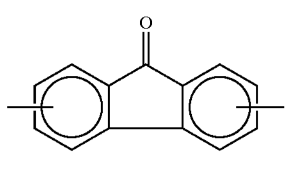
,
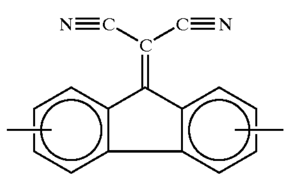
,
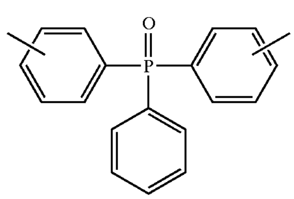
,
or mixtures thereof, B is
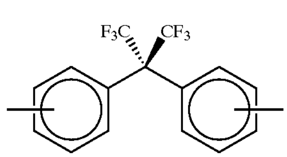
,
-continued
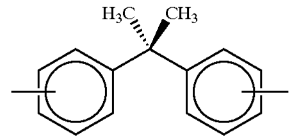
,
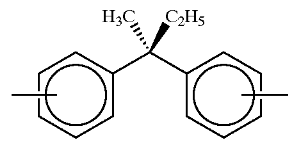
,
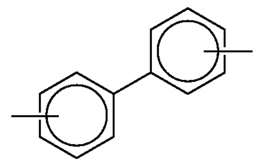
,
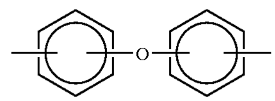
,
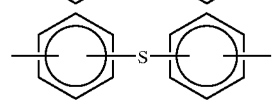
,
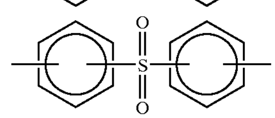
,
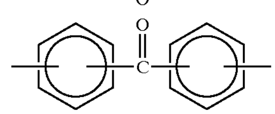
,
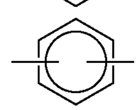
, 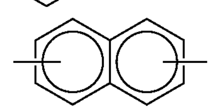
,
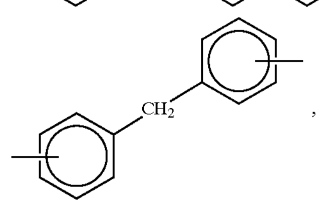
,
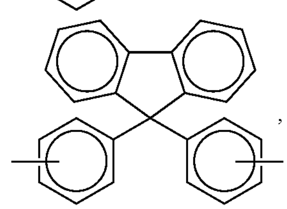
, $-(CH_2)_v-$,
wherein v is an integer of from 1 to about 20,
$-(CH_2O)_t-$
wherein t is an integer of from 1 to about 20,
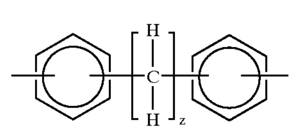
,
wherein z is an integer of from 2 to about 20,

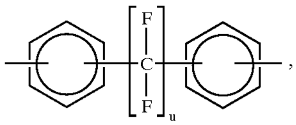
wherein u is an integer of from 1 to about 20,
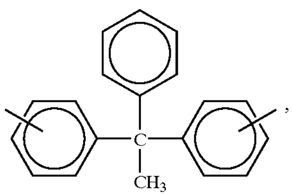
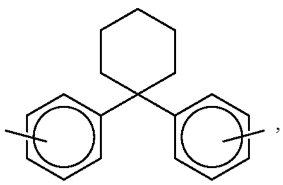
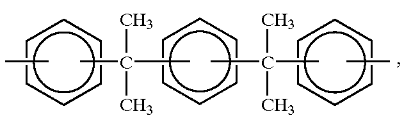
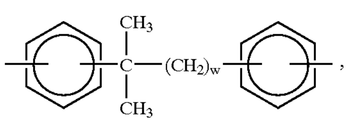
wherein w is an integer of from 1 to about 20,
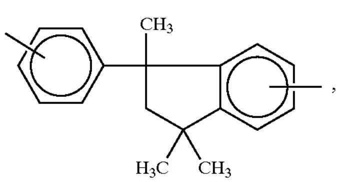
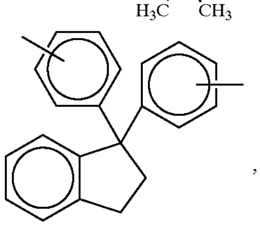
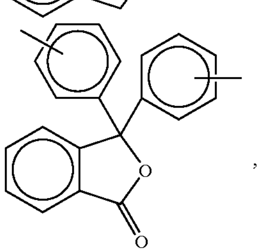
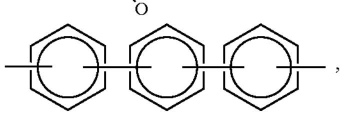
-continued
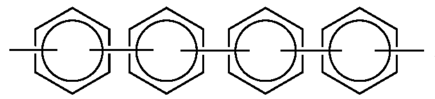
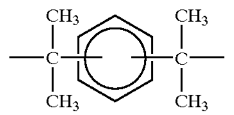
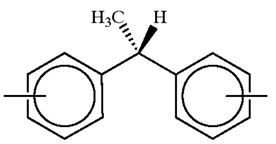
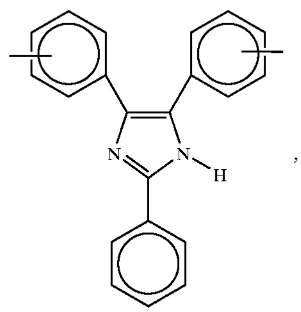
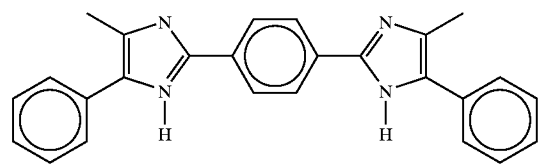
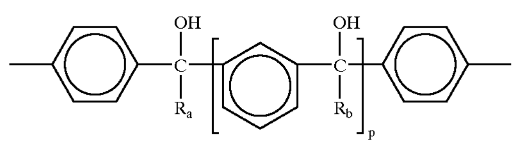
wherein $R_a$ and $R_b$ each, independently of the other, are hydrogen atoms, alkyl groups, aryl groups, arylalkyl groups, alkylaryl groups, or mixtures thereof, and p is an integer of 0 or 1,
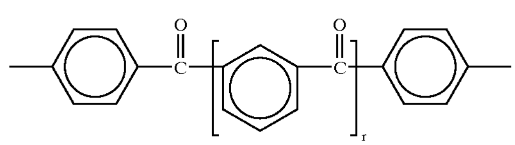
wherein r is an integer of 0 or 1,
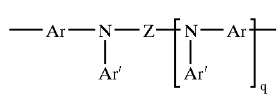 wherein (1) Z is
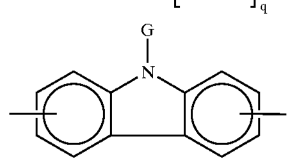
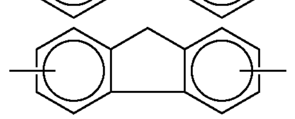

-continued

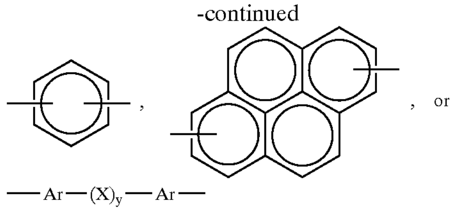

wherein y is 0 or 1; (2) Ar is

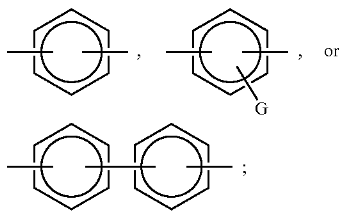

(3) G is an alkyl group selected from alkyl or isoalkyl groups containing from about 2 to about 10 carbon atoms; (4) Ar' is

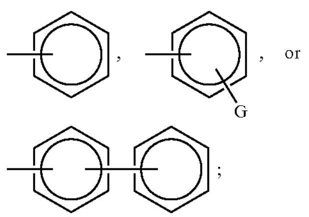

(5) X is

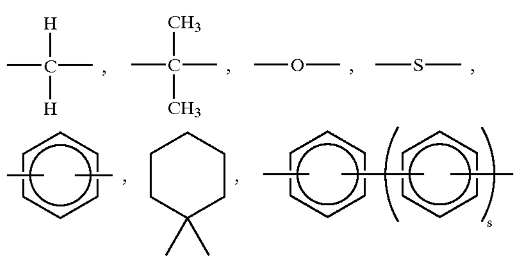

wherein s is 0, 1, or 2,

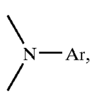

or

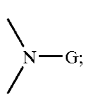

and (6) q is 0 or 1; or mixtures thereof, wherein RX represents the total number of haloalkyl groups in the polymer and is the sum of all $R_1X_1$ groups+all $R_2X_2$ groups+all $R_3X_3$ groups+all $R_4X_4$ groups, and wherein the ratio of unsaturated ester groups to saturated ester groups to RX groups in the polymer is represented by $$\upsilon\epsilon:\sigma\epsilon:\rho\chi$$

wherein $\upsilon\epsilon$ is from about 1 to about 99.99, wherein $\sigma\epsilon$ is from about 0.01 to about 99, wherein $\rho\chi$ is from 0 to about 50, and wherein $\upsilon\epsilon+\sigma\epsilon+\rho\chi=100$.

2. A polymer according to claim 1 wherein at least one of $R_1$, $R_2$, $R_3$, and $R_4$ is a substituted alkyl group, a substituted aryl group, a substituted arylalkyl group, or a substituted alkylaryl group.

3. A polymer according to claim 1 wherein at least one of $R_1$, $R_2$, $R_3$, and $R_4$ is an unsubstituted alkyl group, an unsubstituted aryl group, an unsubstituted arylalkyl group, or an unsubstituted alkylaryl group.

4. A polymer according to claim 1 wherein at least one of $R_1$, $R_2$, $R_3$, and $R_4$ is an alkyl group having one or more hetero atoms therein, an aryl group having one or more hetero atoms therein, an arylalkyl group having one or more hetero atoms therein, or an alkylaryl group having one or more hetero atoms therein.

5. A polymer according to claim 4 wherein the hetero atoms are oxygen, nitrogen, sulfur, silicon, phosphorus, or a mixture thereof.

6. A polymer according to claim 1 wherein at least one of $R_1$, $R_2$, $R_3$, and $R_4$ is an alkyl group having no hetero atoms therein, an aryl group having no hetero atom therein, an arylalkyl group having no hetero atoms therein, or an alkylaryl group having no hetero atoms therein.

7. A polymer according to claim 1 wherein $R_1$, $R_2$, $R_3$, and $R_4$ are all alkyl groups.

8. A polymer according to claim 1 wherein $R_1$, $R_2$, $R_3$, and $R_4$ are all methyl groups.

9. A polymer according to claim 1 wherein $X_1$, $X_2$, $X_3$, and $X_4$ each, independently of the others, are fluorine atoms, chlorine atoms, bromine atoms, or iodine atoms.

10. A polymer according to claim 1 wherein $X_1$, $X_2$, $X_3$, and $X_4$ are each chlorine atoms.

11. A polymer according to claim 1 wherein the UE groups are of the formula

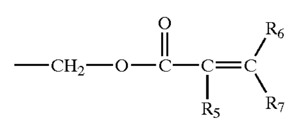

wherein $R_5$, $R_6$, and $R_7$ each, independently of the others, is a hydrogen atom, an alkyl group, an aryl group, an arylalkyl group, an alkylaryl group, or a mixture thereof.

12. A polymer according to claim 1 wherein the UE groups are acrylic acid ester groups, methacrylic acid ester groups, cinnamic acid ester groups, crotonic acid ester groups, ethacrylic acid ester groups, oleic acid ester groups, linoleic acid ester groups, maleic acid ester groups, fumaric acid ester groups, itaconic acid ester groups, citraconic acid ester groups, phenylmaleic acid ester groups, 3-hexene-1,6-dicarboxylic acid ester groups, or mixtures thereof.

13. A polymer according to claim 1 wherein the UE groups are acrylic acid ester groups.

14. A polymer according to claim 1 wherein the SE groups are of the formula

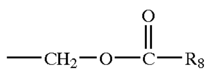

wherein $R_8$ is a hydrogen atom, a saturated alkyl group, an aryl group, an arylalkyl group wherein the alkyl portion thereof is saturated, an alkylaryl group wherein the alkyl portion thereof is saturated, or a mixture thereof.

15. A polymer according to claim 1 wherein the SE groups are esters of acetic acid, esters of propionic acid, esters of butanoic acid, esters of cyclohexanoic acid, esters of polyhydrogenated naphthalene carboxylic acid, or mixtures thereof.

16. A polymer according to claim 1 wherein the SE groups are esters of acetic acid.

17. A polymer according to claim 1 wherein A is

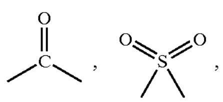

or a mixture thereof and B is

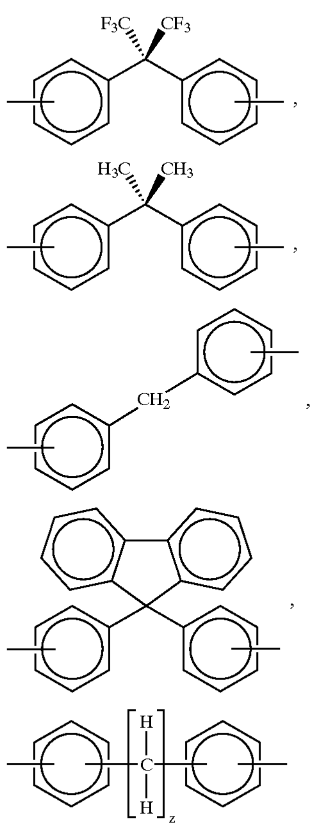

wherein z is an integer of from 2 to about 20, or a mixture thereof.

18. A polymer according to claim 1 wherein A is

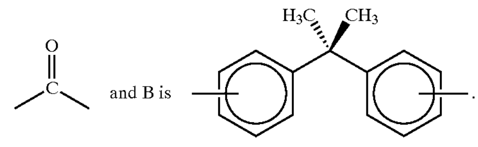

19. A polymer according to claim 1 wherein at least about 0.5 out of every 1 monomer repeat unit has thereon an RX group, a UE group, or a SE group.

20. A polymer according to claim 1 wherein at least about 0.7 out of every 1 monomer repeat unit has thereon an RX group, a UE group, or a SE group.

21. A polymer according to claim 1 wherein no more than about 1.2 out of every 1 monomer repeat unit has thereon an RX group, a UE group, or a SE group.

22. A polymer according to claim 1 wherein no more than about 0.8 out of every 1 monomer repeat unit has thereon an RX group, a UE group, or a SE group.

23. A polymer according to claim 1 wherein $\rho\chi$ is no more than about 10.

24. A polymer according to claim 1 wherein $\rho\chi$ is no more than about 5.

25. A process for preparing a photosensitive polymer which comprises reacting a haloalkylated precursor polymer of the formula

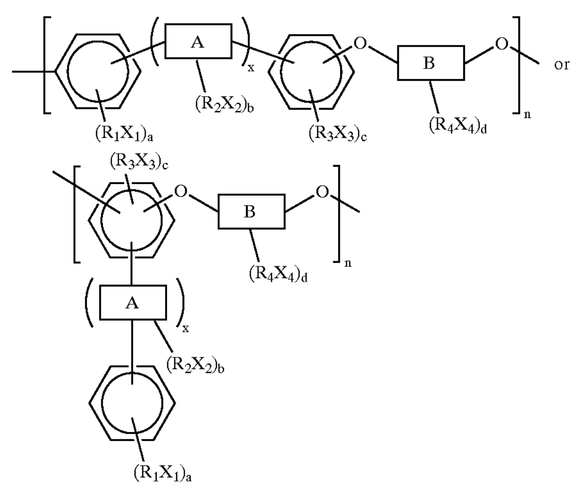

wherein x is an integer of 0 or 1, n is an integer representing the number of repeating monomer units, each of $R_1$, $R_2$, $R_3$, and $R_4$, independently of the others, is an alkyl group, an aryl group, an arylalkyl group, or an alkylaryl group, each of $X_1$, $X_2$, $X_3$, and $X_4$, independently of the others, is a halogen atom, a, b, c, and d are each integers of 0, 1, 2, 3, or 4, provided that at least one of a, b, c, and d is equal to or greater than 1 in at least some of the monomer repeat units of the polymer, A is

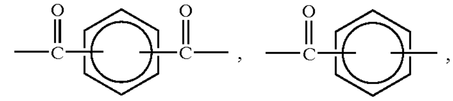

-continued
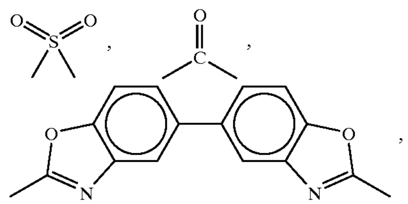
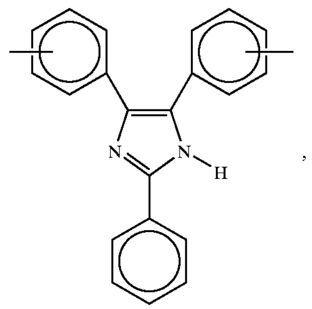
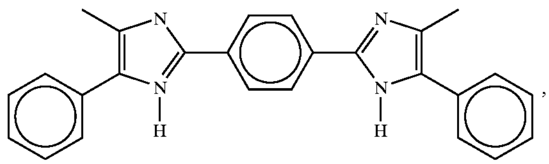
$-O-$ , $-C(CH_3)_2-$ , 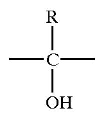
wherein R is a hydrogen atom, an alkyl group, an aryl group, an arylalkyl group, an alkylaryl group, or mixtures thereof,
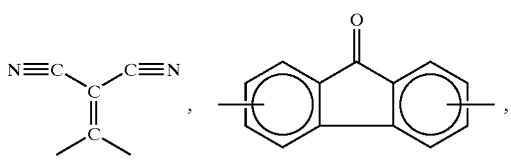
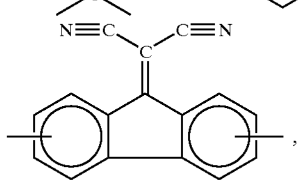
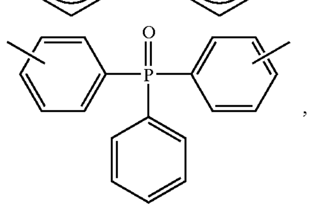
or mixtures thereof, B is
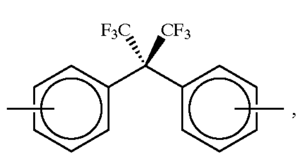
-continued
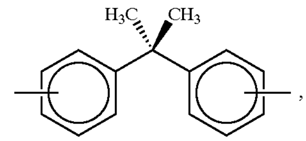
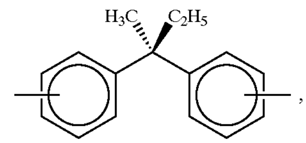
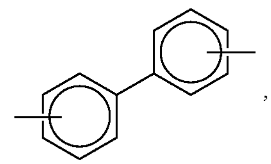
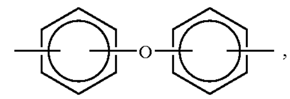
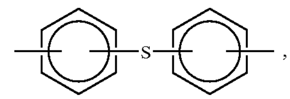
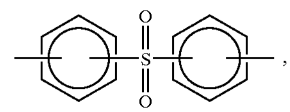
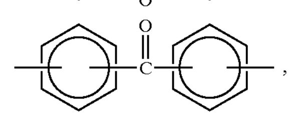
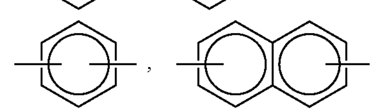
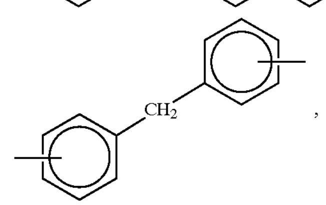
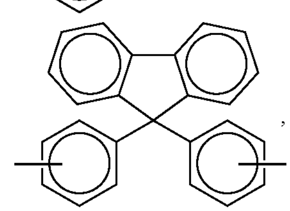 , $-(CH_2)_v-$ ,
wherein v is an integer of from 1 to about 20,
$-(CH_2O)_t-$
wherein t is an integer of from 1 to about 20,
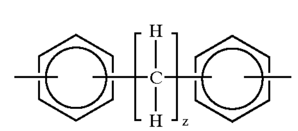
wherein z is an integer of from 2 to about 20,

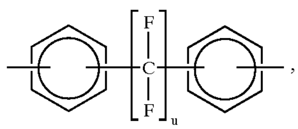
wherein u is an integer of from 1 to about 20,
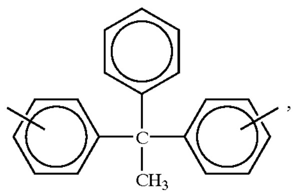
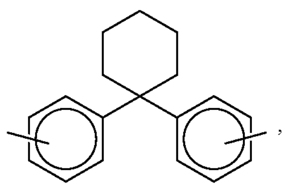
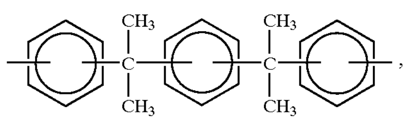
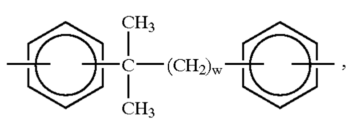
wherein w is an integer of from 1 to about 20,
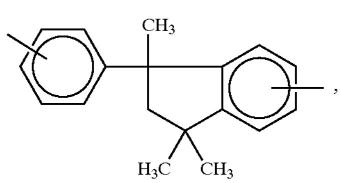
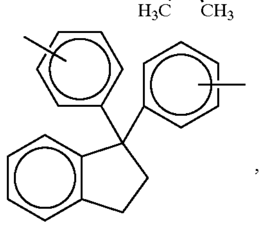
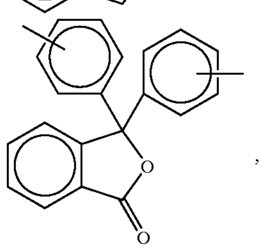
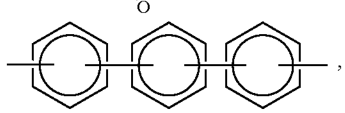
-continued
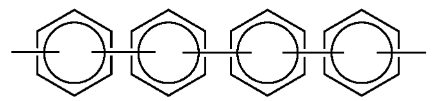
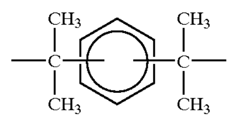
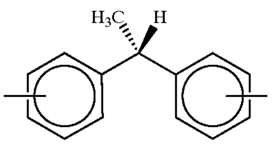
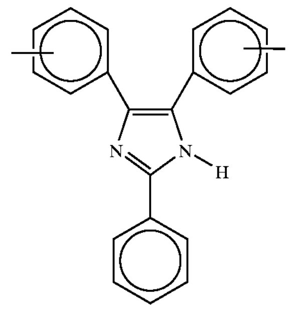
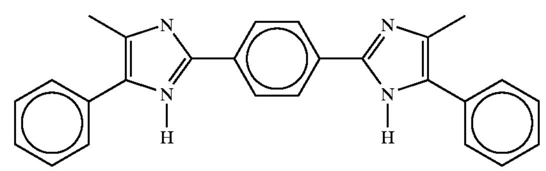
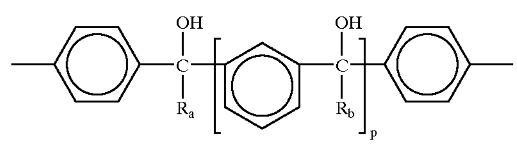
wherein $R_a$ and $R_b$ each, independently of the other, are hydrogen atoms, alkyl groups, aryl groups, arylalkyl groups, alkylaryl groups, or mixtures thereof, and p is an integer of 0 or 1,
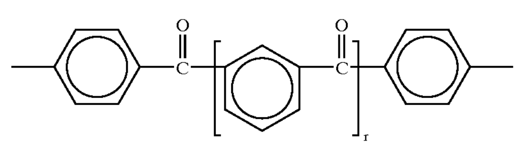
wherein r is an integer of 0 or 1,
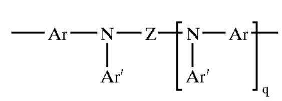 wherein (1) Z is
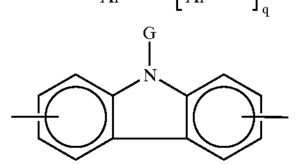
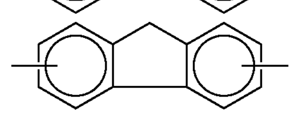

-continued

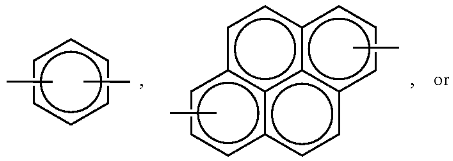

$$—Ar—(X)_y—Ar—$$

wherein y is 0 or 1; (2) Ar is

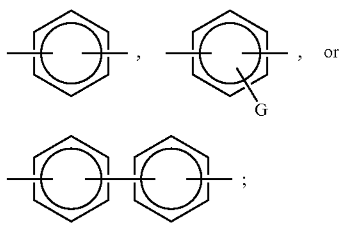

(3) G is an alkyl group selected from alkyl or isoalkyl groups containing from about 2 to about 10 carbon atoms; (4) Ar' is

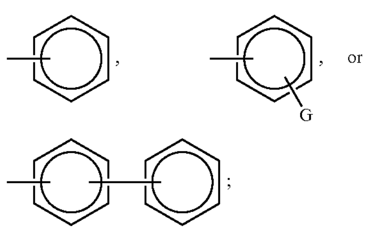

wherein s is 0, 1, or 2,

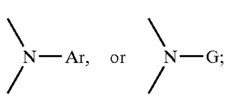

and (6) q is 0 or 1; or mixtures thereof, with an unsaturated ester salt and a saturated ester salt, thereby forming a curable polymer of the formula

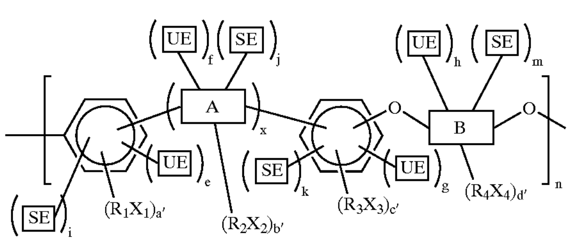

or

-continued

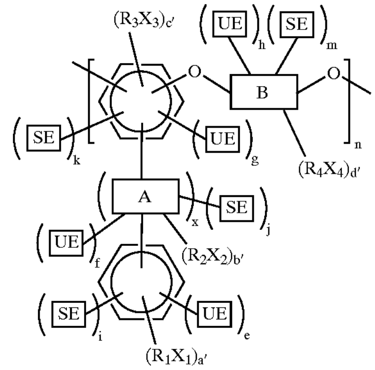

wherein a', b', c', and d' are each, independently of the others, integers of 0, 1, 2, 3, or 4, each UE group, independently of the others, is an unsaturated ester group corresponding to the unsaturated ester salt, e, f, g, and h are each, independently of the others, integers of 0, 1, 2, 3, or 4, provided that at least one of e, f, g, and h is equal to or greater than 1 in at least some of the monomer repeat units of the polymer, each SE group, independently of the others, is a saturated ester group corresponding to the saturated ester salt, and i, j, k, and m are each, independently of the others, integers of 0, 1, 2, 3, or 4, provided that at least one of i, j, k, and m is equal to or greater than 1 in at least some of the monomer repeat units of the polymer, provided that the sum of a'+e+i is less than or equal to 4, provided that the sum of b'+f+j is less than or equal to 4, provided that the sum of c'+g+k is less than or equal to 4, and provided that the sum of d'+h+m is less than or equal to 4, wherein RX represents the total number of haloalkyl groups in the polymer and is the sum of all $R_1X_1$ groups+all $R_2X_2$ groups+all $R_3X_3$ groups+all $R_4X_4$ groups, wherein the ratio of unsaturated ester salt to saturated ester salt is selected so that in the resulting polymer the ratio of unsaturated ester groups to saturated ester groups to RX groups in the polymer is represented by $$\upsilon\epsilon:\sigma\epsilon:\rho\chi$$

wherein $\upsilon\epsilon$ is from about 1 to about 99.99, wherein $\sigma\epsilon$ is from about 0.01 to about 99, wherein $\rho\chi$ is from 0 to about 50, and wherein $\upsilon\epsilon+\sigma\epsilon+\rho\chi=100$.

26. A process according to claim 25 wherein the unsaturated ester salt and the saturated ester salt are added simultaneously to the precursor polymer.

27. A process according to claim 25 wherein the unsaturated ester salt and the saturated ester salt are added sequentially to the precursor polymer.

28. A process according to claim 27 wherein the unsaturated ester salt is added first and the saturated ester salt is added second.

29. A process according to claim 27 wherein the saturated ester salt is added first and the unsaturated ester salt is added second.

30. A process according to claim 25 wherein the reaction is carried out at a temperature of at least about 20° C.

31. A process according to claim 25 wherein the reaction is carried out at a temperature of no more than about 35° C.

32. A process according to claim 25 wherein the reaction is carried out for a period of at least about 30 minutes.

33. A process according to claim 25 wherein the reaction is carried out for a period of at least about 2 hours.

34. A process according to claim 25 wherein the reaction is carried out for a period of no more than about 15 days.

35. A process according to claim 25 wherein the reaction is carried out for a period of no more than about 2 days.

36. A process according to claim 25 wherein the unsaturated ester is present in a molar excess amount.

37. A process according to claim 25 wherein $\rho\chi$ is no more than about 10.

38. A process according to claim 25 wherein $\rho\chi$ is no more than about 5.

39. A process according to claim 1 wherein $\rho\chi$ is no more than about 2.

40. A process according to claim 1 wherein $\rho\chi$ is no more than about 1.

41. A process according to claim 1 wherein $\rho\chi$ is no more than about 0.1.

42. A process according to claim 1 wherein $\rho\chi$ is no more than about 0.

43. A process according to claim 25 wherein $\rho\chi$ is no more than about 2.

44. A process according to claim 25 wherein $\rho\chi$ is no more than about 1.

45. A process according to claim 25 wherein $\rho\chi$ is no more than about 0.1.

46. A process according to claim 25 wherein $\rho\chi$ is no more than about 0.

* * * * *